United States Patent
Yamahira et al.

(10) Patent No.: US 10,932,397 B2
(45) Date of Patent: Feb. 23, 2021

(54) POWER CONVERSION DEVICE

(71) Applicant: DENSO CORPORATION, Kariya (JP)

(72) Inventors: Yuu Yamahira, Kariya (JP); Tetsuya Matsuoka, Kariya (JP); Kazuma Fukushima, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/787,122

(22) Filed: Feb. 11, 2020

(65) Prior Publication Data
US 2020/0177101 A1    Jun. 4, 2020

Related U.S. Application Data

(63) Continuation of application No. PCT/JP2018/029239, filed on Aug. 3, 2018.

(30) Foreign Application Priority Data

Aug. 11, 2017   (JP) ................. 2017-156257

(51) Int. Cl.
*H05K 7/20* (2006.01)
*H02M 7/00* (2006.01)
*H02M 1/00* (2006.01)

(52) U.S. Cl.
CPC ........ *H05K 7/20927* (2013.01); *H02M 7/003* (2013.01); *H02M 2001/0009* (2013.01)

(58) Field of Classification Search
CPC . H02M 2001/0009; H02M 2007/4822; H02M 7/003; H05K 7/2089;

(Continued)

(56) References Cited

U.S. PATENT DOCUMENTS

2011/0181105 A1*  7/2011  Michinaka ......... H05K 7/20927
                                              307/9.1
2012/0300521 A1* 11/2012  Hida ................. H05K 7/20927
                                              363/131

(Continued)

FOREIGN PATENT DOCUMENTS

JP    2009-188346 A    8/2009
JP    2016-46842 A     4/2016
JP    2017-93221 A     5/2017

OTHER PUBLICATIONS

Sep. 18, 2018 Search Report issued in International Patent Application No. PCT/JP2018/029239.

*Primary Examiner* — Fred E Finch, III
(74) *Attorney, Agent, or Firm* — Oliff PLC

(57) ABSTRACT

In a power conversion device, each of semiconductor modules of a layered body includes a body portion incorporating a plurality of switching elements and a plurality of power terminals protruding therefrom. The semiconductor modules include upper-arm switching elements and lower-arm switching element that are alternately layered in a layering direction of the layered body. A capacitor is disposed on one side of the layered body and a current sensor is disposed on an opposite side of the layered body, in an orthogonal direction orthogonal to both a protruding direction of the power terminals and the layering direction. Each of the semiconductor modules includes, as the power terminals, two collector terminals connected to a collector electrode of the switching element and one emitter terminal connected to an emitter electrode of the switching element, and the emitter terminal is disposed between the two collector terminals in the orthogonal direction.

4 Claims, 19 Drawing Sheets

(58) Field of Classification Search
CPC ........... H05K 7/20927; H05K 7/20845; H05K 7/20872; H01L 25/072; H01L 25/117
See application file for complete search history.

(56) References Cited

U.S. PATENT DOCUMENTS

| | | |
|---|---|---|
| 2013/0121052 A1 | 5/2013 | Yamaura |
| 2013/0271916 A1* | 10/2013 | Steger .................. H01L 23/473 361/699 |
| 2014/0092663 A1* | 4/2014 | Shimizu ................ H02M 7/003 363/141 |
| 2017/0223875 A1* | 8/2017 | Tsuyuno ........... H01L 23/49541 |
| 2017/0301662 A1* | 10/2017 | Kimura ............. H01L 23/49548 |
| 2018/0281605 A1* | 10/2018 | Sawazaki ............ B60L 11/1803 |
| 2019/0333909 A1* | 10/2019 | Sugita ................... H01L 25/112 |
| 2020/0058574 A1* | 2/2020 | Hayase ................. H01L 23/473 |

* cited by examiner

POWER CONVERSION DEVICE

CROSS REFERENCE TO RELATED APPLICATIONS

The present application is based on Japanese Patent Application No. 2017-156257 filed on Aug. 11, 2017, the contents of which are incorporated herein by reference.

BACKGROUND

Technical Field

The present disclosure relates to a power conversion device in which semiconductor modules and cooling pipes are layered.

Related Art

A power conversion device has been known in which semiconductor modules each incorporating switching elements and cooling pipes cooling the semiconductor modules are layered to form a layered body. The semiconductor modules each include a body portion incorporating the switching elements and power terminals protruding from each of the switching elements. The power conversion device is configured such that the switching elements are caused to perform on/off operations for power conversions between DC power and AC power.

The switching elements include upper-arm switching elements disposed on an upper arm side and lower-arm switching elements disposed on a lower arm side. In the power conversion device, both the upper-arm switching element and the lower-arm switching element are often provided in one semiconductor module.

Additionally, the power conversion device includes a capacitor smoothing a DC voltage applied to each of the semiconductor modules and a current sensor measuring an output current from the semiconductor module. In the power conversion device, the capacitor is positioned adjacent to the layered body in a protruding direction of the power terminals (see FIG. 24).

DESCRIPTION OF SPECIFIC EMBODIMENTS

Figure 1:
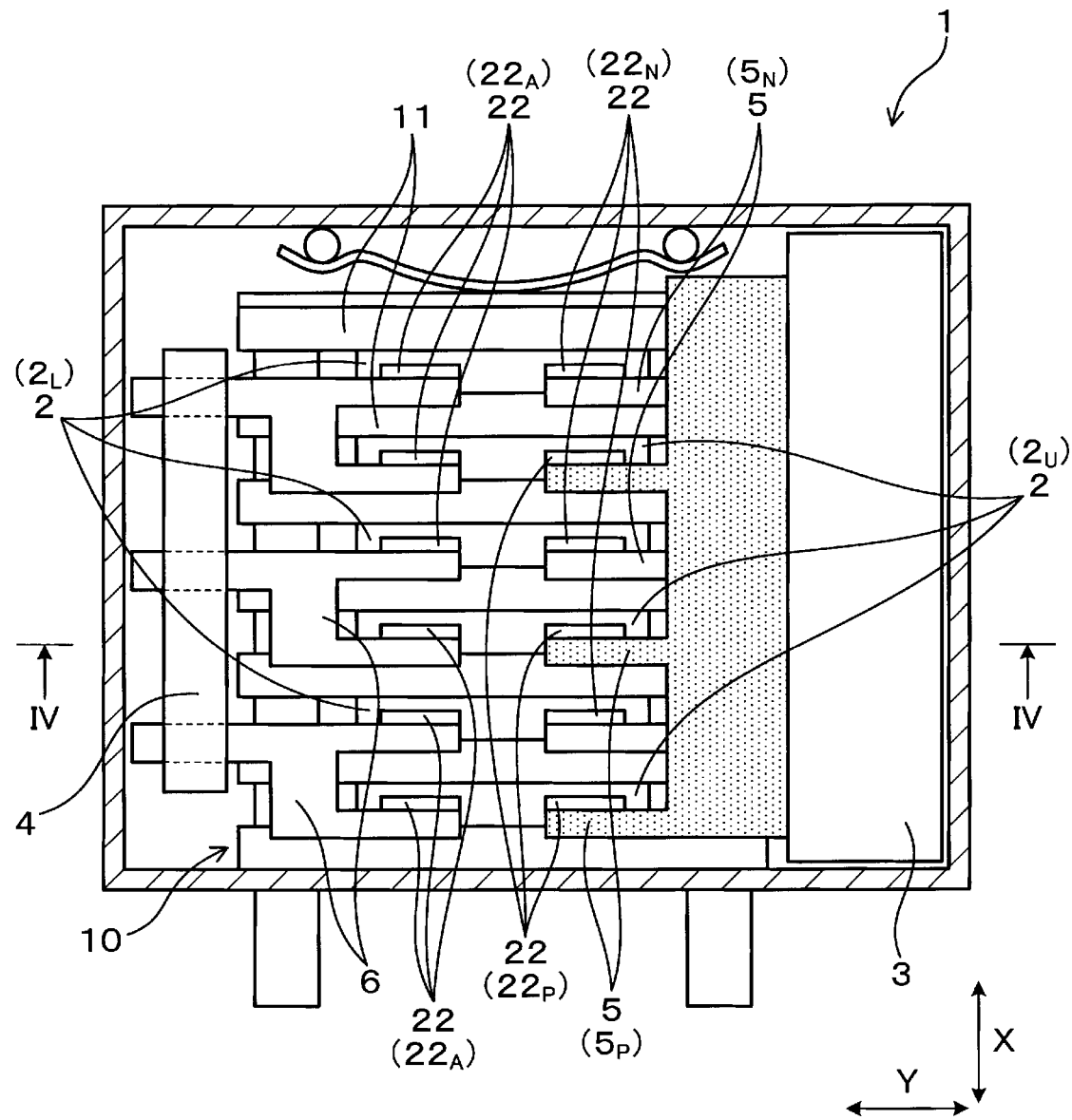
FIG. 1 is a cross-sectional view of a power conversion device according to a first embodiment.

In the power conversion device, as disclosed in JP-A-2013-106397, components such as the capacitor are disadvantageously difficult to cool. That is, in the power conversion device, the capacitor is positioned adjacent to the layered body in the protruding direction (see FIG. 24). Thus, the power terminals obstruct the capacitor from being placed close to the layered body, hindering the capacitor from being cooled by the cooling pipes. Additionally, in this configuration, a long bus bar is used to connect the semiconductor module and the capacitor and thus generates increased Joule heat. The heat is likely to increase the temperature of the capacitor.

Additionally, in the power conversion device, both the upper atm switching element and the lower arm switching element are often provided in one semiconductor module as described above. In this case, for output, a single power terminal (that is, an output terminal) is used (see FIG. 25), and an output current constantly flows through the single output terminal. Thus, the output terminal generates a large amount of heat, which is likely to be transmitted to the capacitor or the current sensor.

Additionally, in a case where the capacitor is positioned adjacent to the layered body in the protruding direction as in the above-described power conversion device, the power conversion device has an increased length in the protruding direction, disadvantageously hindering miniaturization of the power conversion device.

In view of the foregoing, it is desired to have a power conversion device capable of improving efficiency of cooling of the capacitor and the current sensor and reducing the length of the entire device in the protruding direction of the power terminals.

A first aspect of the present disclosure provides a power conversion device including:

a layered body including semiconductor modules each incorporating switching elements and cooling pipes cooling the semiconductor modules, the semiconductor modules and the cooling pipes being layered;

a capacitor smoothing a DC voltage applied to each of the semiconductor modules; and a current sensor measuring a current flowing through each of the switching elements, wherein the semiconductor modules include upper-arm switching elements disposed on an upper arm side and lower-arm switching elements disposed on a lower arm side, the upper-arm switching elements and the lower-arm switching element being alternately layered in a layering direction of the layered body, each of the semiconductor modules includes a body portion incorporating the switching elements and a plurality of power terminals protruding from the body portion, and the capacitor is disposed on one side of the layered body and the current sensor is disposed on an opposite side of the layered body, in an orthogonal direction orthogonal to both a protruding direction of the power terminals and the layering direction.

In the power conversion device configured as above, the capacitor is disposed on one side of the layered body and the current sensor is disposed on the opposite side of the layered body, in the orthogonal direction. Thus, the capacitor and the current sensor can be placed in proximity to the layered body and cooled by the cooling pipes in the layered body. Additionally, a distance from each of the semiconductor modules to the capacitor or the current sensor is reduced, enabling a reduction in the length of a bus bar connecting the semiconductor module and the capacitor or the current sensor. Accordingly, the amount of heat generated by the bus bar can be reduced, allowing suppression of a disadvantageous increase in the temperature of the capacitor or the like caused by the heat.

Additionally, in a case where the capacitor is disposed on one side of the layered body and the current sensor is disposed on the opposite side of the layered body, in the orthogonal direction, as in the present aspect, the capacitor, the layered body, and the current sensor are prevented from being disposed overlapping one another in the protruding direction. This enables a reduction in the length of the power conversion device in the protruding direction.

Additionally, in the power conversion device, the semiconductor module on the upper arm side (that is, the upper-arm semiconductor module) is separated from the semiconductor module on the lower arm side (that is, the lower-arm semiconductor module). Thus, a power terminal for output (that is, an output terminal) can be formed for each of the upper-arm semiconductor module and the lower-arm semiconductor module. Accordingly, an output current can be passed alternately to the output terminal on the upper arm side and to the output terminal on the lower arm side, enabling a reduction in the amount of heat generated by the output terminals. Thus, a disadvantageous increase in the temperature of the capacitor or the current sensor can be suppressed that is caused by transmission of the generated heat to the capacitor or the current sensor.

As described above, according to the above-described aspect, a power conversion device can be provided that is capable of improving efficiency of cooling of the capacitor and the current sensor and reducing the length of the entire device in the protruding direction of the power terminals.

Hereinafter, the present embodiment will be described with reference to the accompanying drawings. In order to facilitate understanding of the description, the same structural elements in the drawings share the same reference signs wherever possible, and overlapping description is omitted.

First Embodiment

Figure 2:
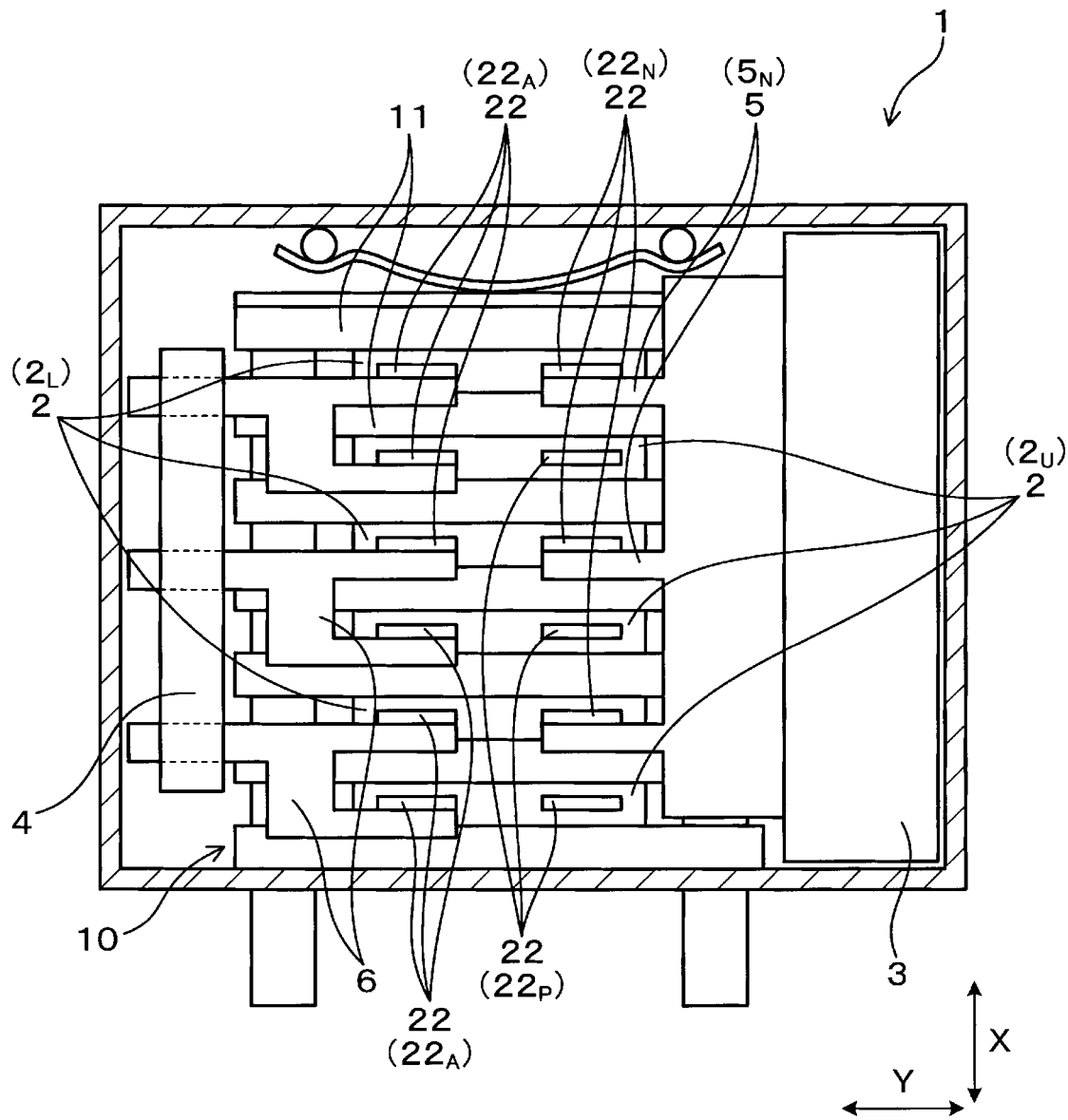
FIG. 2 is a diagram corresponding to FIG. 1 from which a positive electrode bus bar has been removed.
Figure 3:
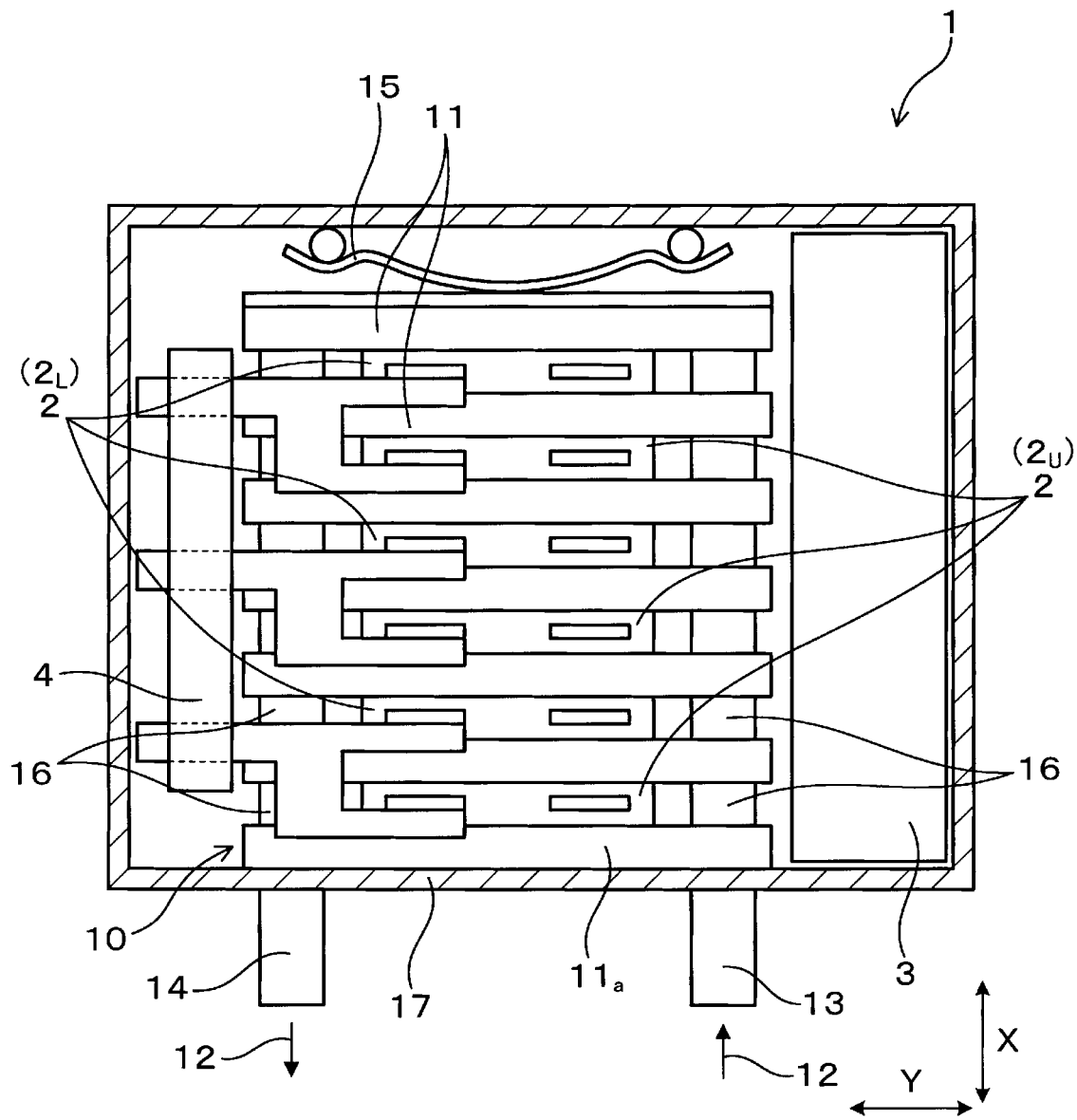
FIG. 3 is a diagram corresponding to FIG. 2 from which a negative electrode bus bar has been removed.
Figure 4:
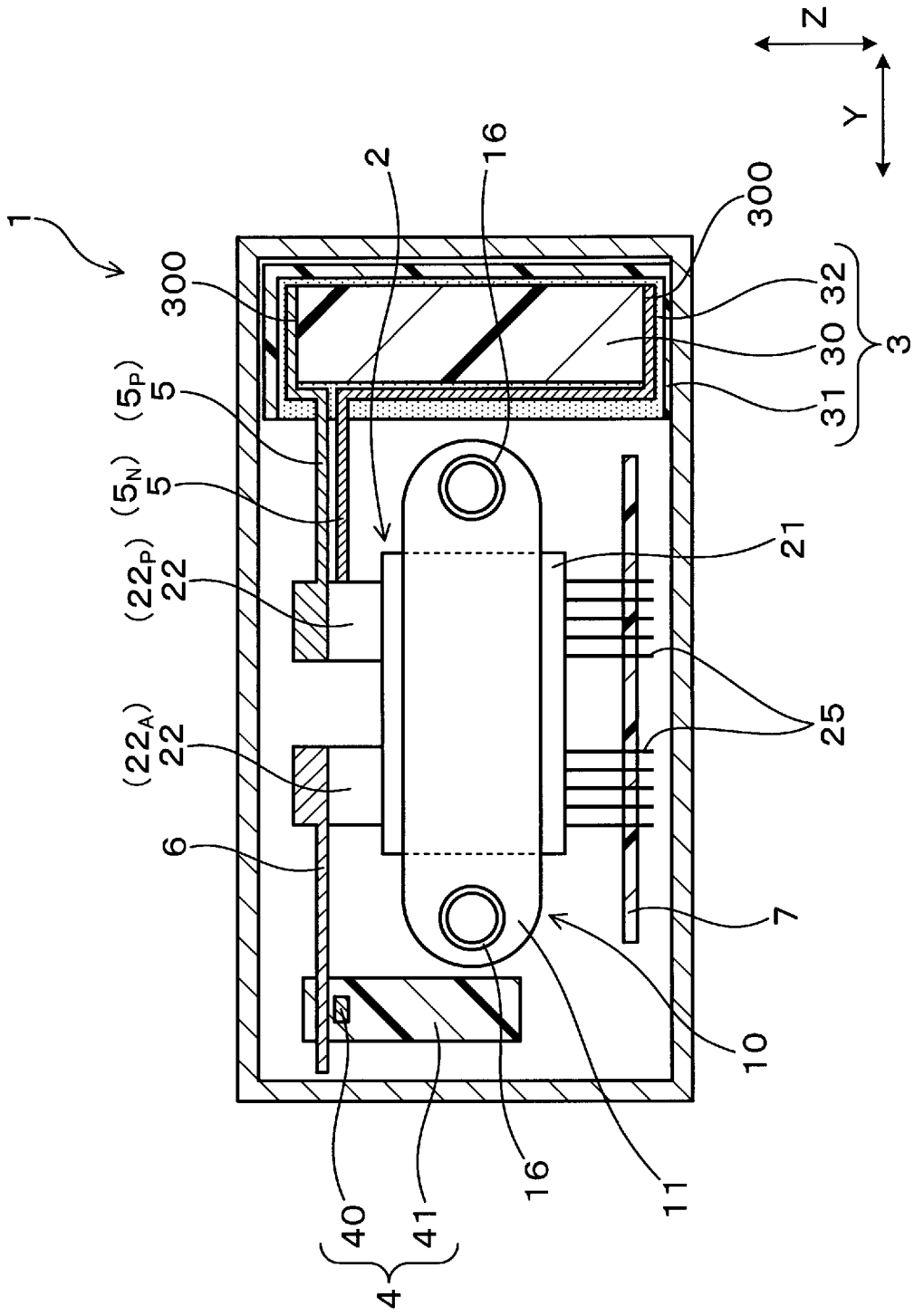
FIG. 4 is a cross-sectional view taken along IV-IV in FIG. 1.
Figure 5:
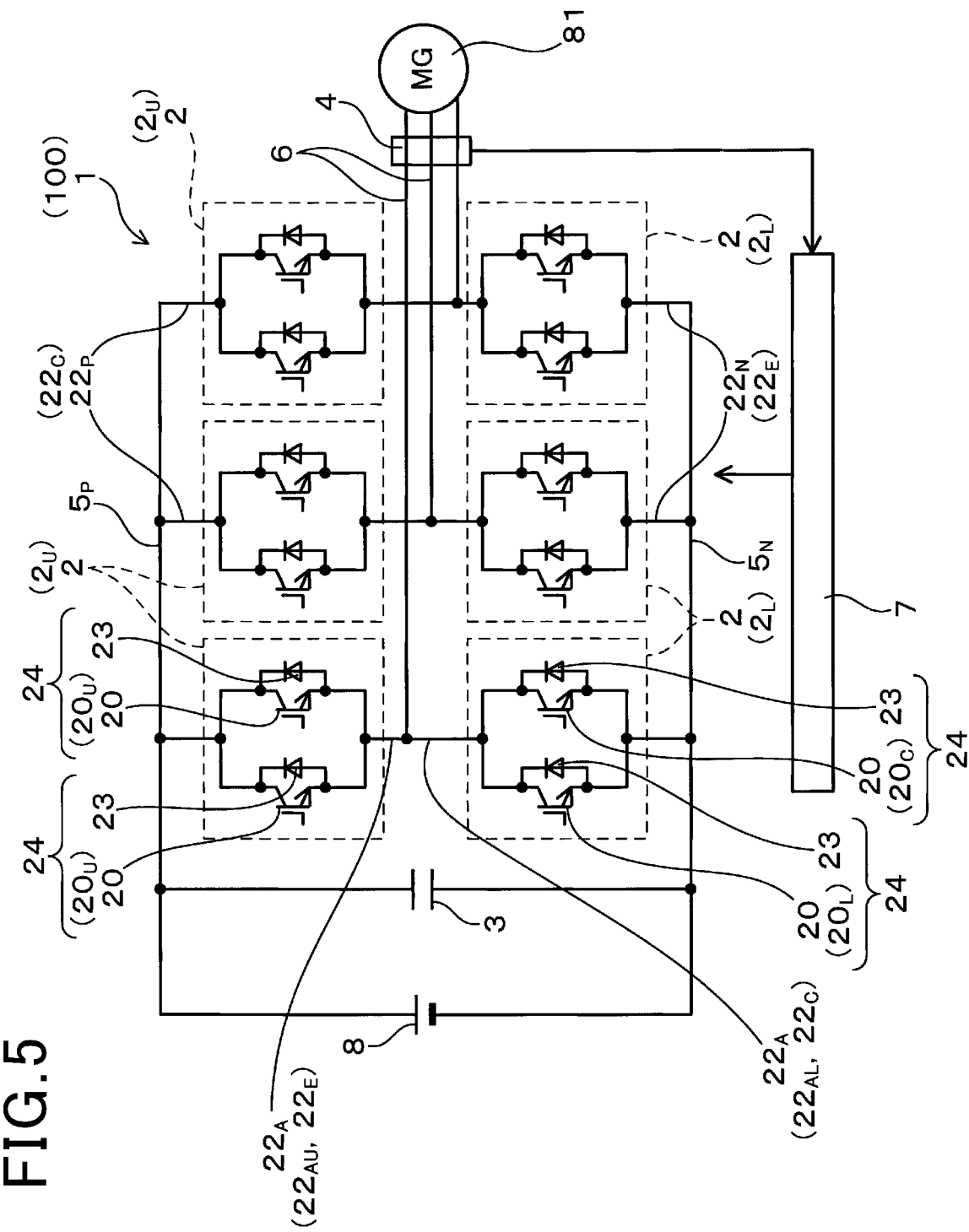
FIG. 5 is a circuit diagram of the power conversion device according to the first embodiment.
Figure 6:
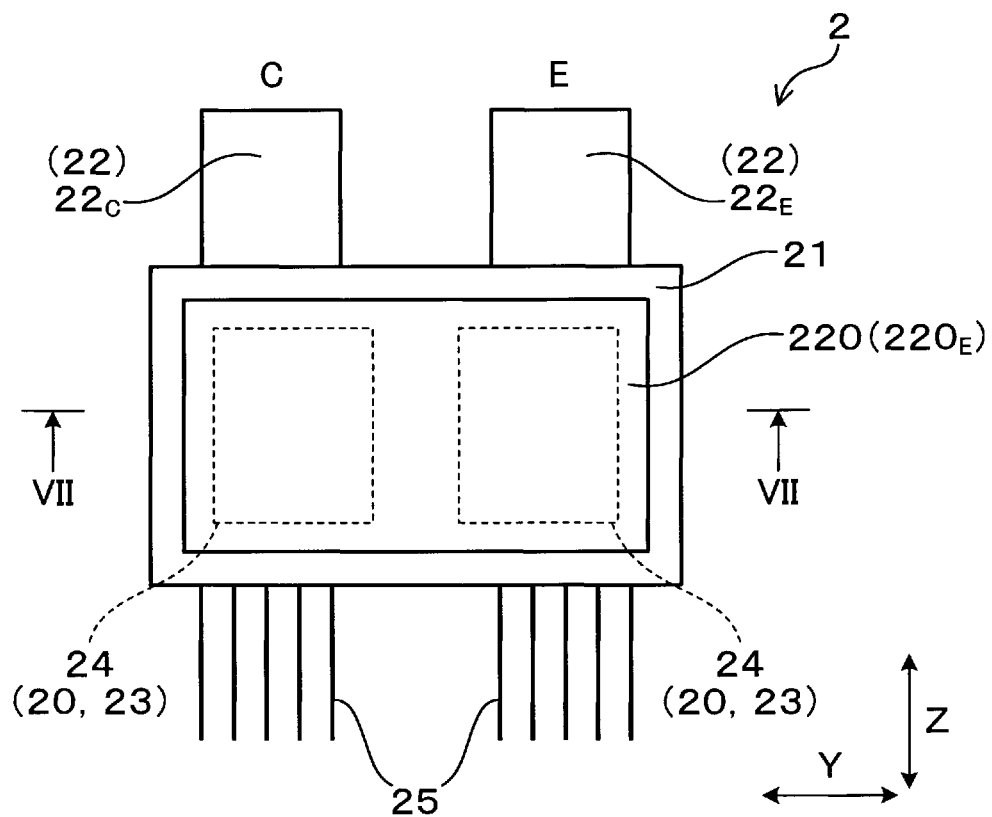
FIG. 6 is a plan view of a semiconductor module according to the first embodiment.
Figure 7:
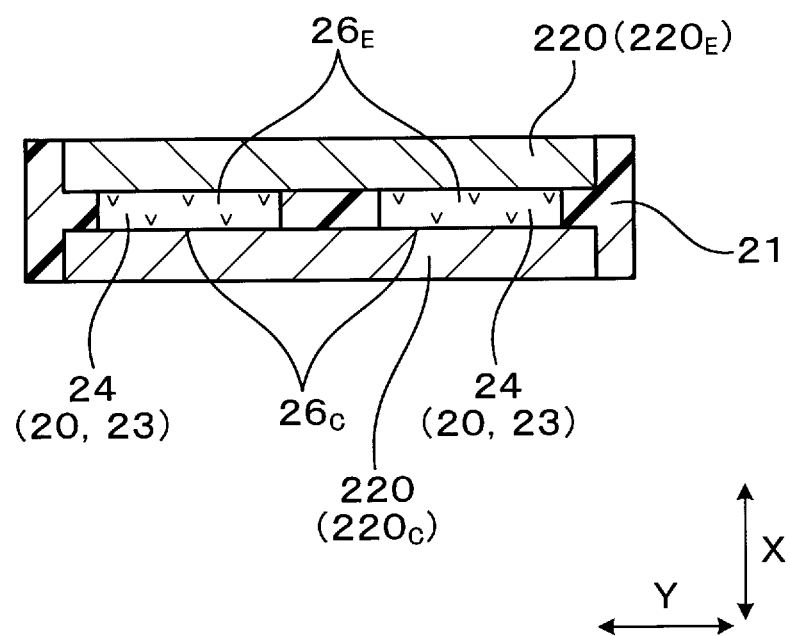
FIG. 7 is a cross-sectional view taken along VII-VII in FIG. 6.

Embodiments of the above-described power conversion device will be described with reference to FIGS. 1 to 9. As illustrated in FIG. 1 and FIG. 4, a power conversion device 1 of the present embodiment includes a layered body 10, a capacitor 3, and a current sensor 4. The layered body 10 includes semiconductor modules and cooling pipes 11 that are layered. As illustrated in FIGS. 5 to 7, a semiconductor module 2 incorporates switching elements 20.

As illustrated in FIG. 5, the capacitor 3 smooths a DC voltage applied to each of the semiconductor modules 2. The current sensor 4 measures a current (in the present embodiment, an output current) flowing through each of the switching elements 20.

The semiconductor modules 2 includes upper-arm semiconductor modules $2_U$ disposed on an upper arm side and lower-arm semiconductor modules $2_L$ disposed on a lower arm side. As illustrated in FIGS. 1 to 3, the upper-arm semiconductor modules $2_U$ and the lower-arm semiconductor modules $2_L$ are alternately layered in a layering direction (hereinafter also referred to as the X direction) of the layered body 10.

As illustrated in FIGS. 1 and 4, each of the semiconductor modules 2 includes a body portion 21 incorporating the switching elements 20, and a plurality of power terminals 22 protruding from the body portion 21.

The capacitor 3 is disposed on one side of the layered body 10 and the current sensor 4 is disposed on the opposite side of the layered body 10, in an orthogonal direction (hereinafter also referred to as the Y direction) orthogonal to both a protruding direction (hereinafter also referred to as the Z direction) of the power terminals 22 and the X direction.

The power conversion device 1 of the present embodiment is an in-vehicle power conversion device to be mounted in a vehicle such as an electric car or a hybrid car. As illustrated in FIG. 5, in the present embodiment, a plurality of the semiconductor modules 2 are used to form an inverter circuit 100. Each of the semiconductor modules 2 is caused to perform switching operations to convert, into AC power, DC power supplied from a DC power supply 8. Then, the AC power obtained is used to drive a three-phase AC motor 81 to cause the vehicle to travel.

As illustrated in FIG. 5, the switching elements 20 include upper-arm switching elements $20_U$ disposed on the upper arm side and lower-arm switching elements $20_L$ disposed on the lower arm side. The upper-arm semiconductor module $2_U$ incorporates a plurality of the upper-arm switching elements $20_U$ connected together in parallel. Additionally, the lower-arm semiconductor module $2_L$ incorporates a plurality of the lower-arm switching elements $20_L$ connected together in parallel.

A freewheel diode 23 is connected in antiparallel with each of the switching elements 20. The switching element 20 and the freewheel diode 23 are formed in the same semiconductor chip 24 (see FIG. 6 and FIG. 7). In the present embodiment, an RC-IGBT (Reverse Conducting IGBT) is used as the switching element 20.

As illustrated in FIG. 5, each semiconductor module 2 includes a collector terminal $22_C$ and an emitter terminal $22_E$. The collector terminal $22_C$ of each of the upper-arm semiconductor modules $2_U$ is used as a positive terminal $22_P$, and the emitter terminal $22_E$ of each of the lower-arm semiconductor modules $2_L$ is used as a negative terminal $22_N$. A positive electrode bus bar $5_P$ is connected to the positive electrode terminal $22_P$, and a negative electrode bus bar $5_N$ is connected to the negative electrode terminal $22_N$ (see FIGS. 1 to 4). The semiconductor modules 2 are connected to the capacitor 3 via the bus bars $5_P$ and $5_N$.

The emitter terminal $22_E$ of the upper-arm semiconductor module $2_U$ and the collector terminal $22_C$ of the lower-arm semiconductor module $2_L$ are used as an AC terminal $22_A$. An AC bus bar 6 is connected to the AC terminal $22_A$ (see FIGS. 1 to 4). A current flowing through the AC bus bar 6 is measured by the current sensor 4. The current sensor 4 transmits a measured value of the current to the control unit 7. The control unit 7 utilizes the measured value for switching control of the semiconductor module 2.

As illustrated in FIGS. 1 to 4, the power terminals 22 include the DC terminals $22_P$ and $22_N$ connected to the capacitor 3, and the AC terminals $22_A$. A current output from each of the AC terminals $22_A$ is measured by the current sensor 4. Each of the semiconductor modules 2 includes one DC terminal (that is, the positive electrode terminal $22_P$ or the negative electrode terminal $22_N$), and one AC terminal $22_A$. The DC terminals $22_P$ and $22_N$ are disposed closer to the capacitor 3 in the Y direction, and the AC terminals $22_A$ are disposed closer to the current sensor 4 in the Y direction.

As illustrated in FIG. 4, the capacitor 3 includes a capacitor element 30, a capacitor case 31, and a sealing member 32. The sealing member 32 seals the capacitor element 30 in the capacitor case 31. The DC bus bars $5_P$ and $5_N$ are connected to an electrode surface 300 of the capacitor element 30.

Additionally, the current sensor 4 includes a sensor element 40 and a holding unit 41 holding the sensor element 40. As the sensor element 40, a Hall element, a GMR element, or the like is used.

Now, a structure of the semiconductor module 2 will be described in further detail. As illustrated in FIG. 6 and FIG. 7, the semiconductor module 2 includes the body portion 21 incorporating the switching elements 20 and the two power terminals 22 protruding from the body portion 21. As illustrated in FIG. 7, the switching elements 20 are interposed between the emitter-side heat sink $220_E$ and the collector-side heat sink $220_C$. The emitter-side heat sink $220_E$ is connected to an emitter electrode $26_E$ of the switching element 20, and the collector-side heat sink $220_C$ is connected to a collector electrode $26_C$. The heat sinks $220_E$ and $220_C$ are exposed from the body portion 21. Additionally, the emitter terminal $22_E$ protrudes from the emitter-side heat sink $220_E$, and the collector terminal $22_C$ protrudes from the collector-side heat sink $220_C$.

Now, a structure of the layered body 10 will be described in further detail. As illustrated in FIG. 3, in the present embodiment, two cooling pipes 11 adjacent to each other in the X direction are coupled together by coupling pipes 16. The coupling pipes 16 are disposed at both ends of the cooling pipe 11 in the Y direction. Additionally, an end cooling pipe 11a included in the plurality of cooling pipes 11 and positioned at one end in the X direction connects to an inlet pipe 13 through which a refrigerant 12 is guided into the cooling pipes 11 and an outlet pipe 14 through which the refrigerant 12 is guided out of the cooling pipes 11. In a case where the refrigerant 12 is guided into the cooling pipes 11 through the inlet pipe 13, the refrigerant 12 flows through all the cooling pipes 11 via the coupling pipes 16 and is guided out from the outlet pipe 14. Thus, the semiconductor modules 2 are cooled.

Additionally, a pressure application member 15 (in the present embodiment, a leaf spring) is disposed adjacent to the layered body 10 in the X direction. The pressure application member 15 is used to apply pressure to the layered body 10 in the X direction. Thus, the layered body 10 is fixed in a case 17, and an appropriate contact pressure is applied between the semiconductor modules 2 and the cooling pipes 11.

Now, functions and effects of the present embodiment will be described. As illustrated in FIGS. 1 and 4, the capacitor 3 is disposed on one side of the layered body 10 and the current sensor 4 is disposed on the opposite side of the layered body 10, in the Y direction. Thus, the capacitor 3 and the current sensor 4 can be placed closer to the layered body 10 and cooled by the cooling pipes 11 in the layered body 10. Additionally, a distance from each of the semiconductor modules 2 to the capacitor 3 or the current sensor 4 is reduced, enabling a reduction in the lengths of bus bars 5 and 6 connecting each semiconductor module 2 to the capacitor 3 and the current sensor 4, respectively. Accordingly, the amount of heat generated by the bus bars 5 and 6 can be reduced, allowing suppression of a disadvantageous increase in the temperature of the capacitor 3 or the current sensor 4 caused by the heat.

Figure 24:
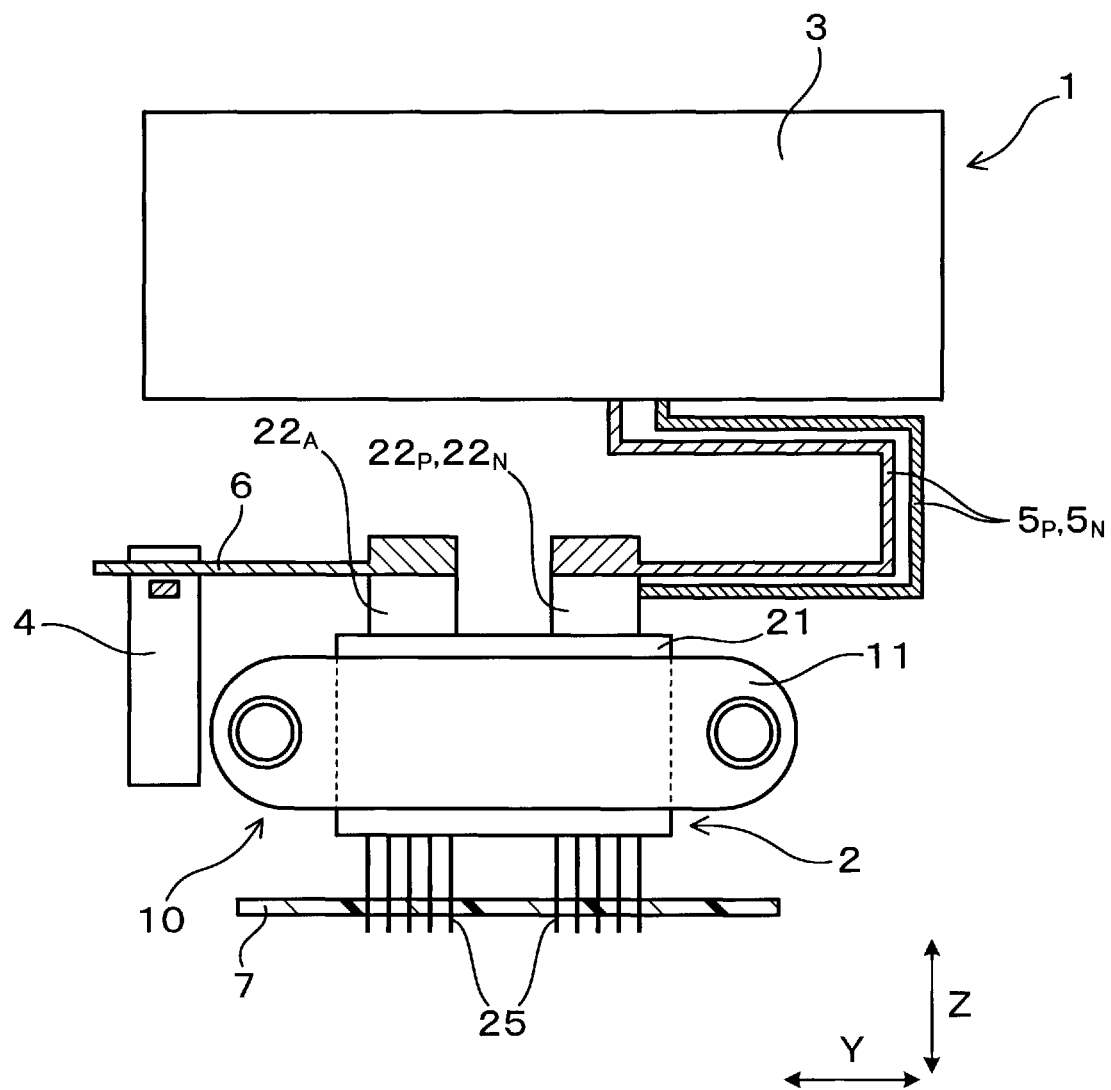
FIG. 24 is a cross-sectional view of a power conversion device according to a first comparative embodiment.

In a known power conversion device 1, the capacitor 3 is positioned adjacent to the layered body 10 in the Z direction as illustrated in FIG. 24. Thus, the power terminals 22 obstruct the capacitor 3 from being placed close to the cooling pipes 11, hindering the capacitor 3 from being efficiently cooled. Additionally, a long current path length from each semiconductor module 2 to the capacitor 3 leads to a large amount of heat generated by the DC bus bars $5_P$ and $5_N$, and the capacitor 3 is likely to have an increased temperature. In contrast, as illustrated in FIG. 4, in a case where the capacitor 3 is positioned adjacent to the layered body 10 in the Y direction as in the present embodiment, the capacitor 3 can be placed closer to the cooling pipes 11, facilitating cooling of the capacitor 3. Additionally, the lengths of the DC bus bars $5_P$ and $5_N$ can be reduced, enabling a reduction in the amount of heat generated by the DC bus bars $5_P$ and $5_N$. This allows suppression of an increase in the temperature of the capacitor 3.

Additionally, as illustrated in FIG. 24, in a case where the capacitor 3 is positioned adjacent to the layered body 10 in the Z direction as in the related art, the power conversion device 1 is likely to have an increased length in the Z direction. Thus, the power conversion device 1 tends to have an increased size. In contrast, as illustrated in FIG. 4, in a case where the capacitor 3 is disposed on one side of the layered body 10 and the current sensor 4 is disposed on the opposite side of the layered body 10, in the Y direction, as in the present embodiment, the length of the power conversion device 1 in the Z direction can be reduced. Thus, the power conversion device 1 can be miniaturized.

Additionally, in the present embodiment, the upper-arm semiconductor modules $2_U$ are separated from the lower-arm semiconductor modules $2_L$ as illustrated in FIG. 5. That is, the upper-arm switching elements $20_U$ are separated from the lower-arm switching elements $20_L$. Thus, the AC terminal $22_A$ can be formed for each of the upper-arm semiconductor modules $2_U$ and each of the lower-arm semiconductor modules $2_L$. Accordingly, a current flows alternately through the upper-arm-side AC terminal $22_{AU}$ and the lower-armside AC terminal $22_{AL}$, enabling a reduction in the amount of heat generated by the AC terminal $22_A$. This allows suppression of a disadvantageous increase in the temperature of the capacitor 3 or the current sensor 4 caused by transmission of the heat to the capacitor 3 or the current sensor 4.

Figure 25:
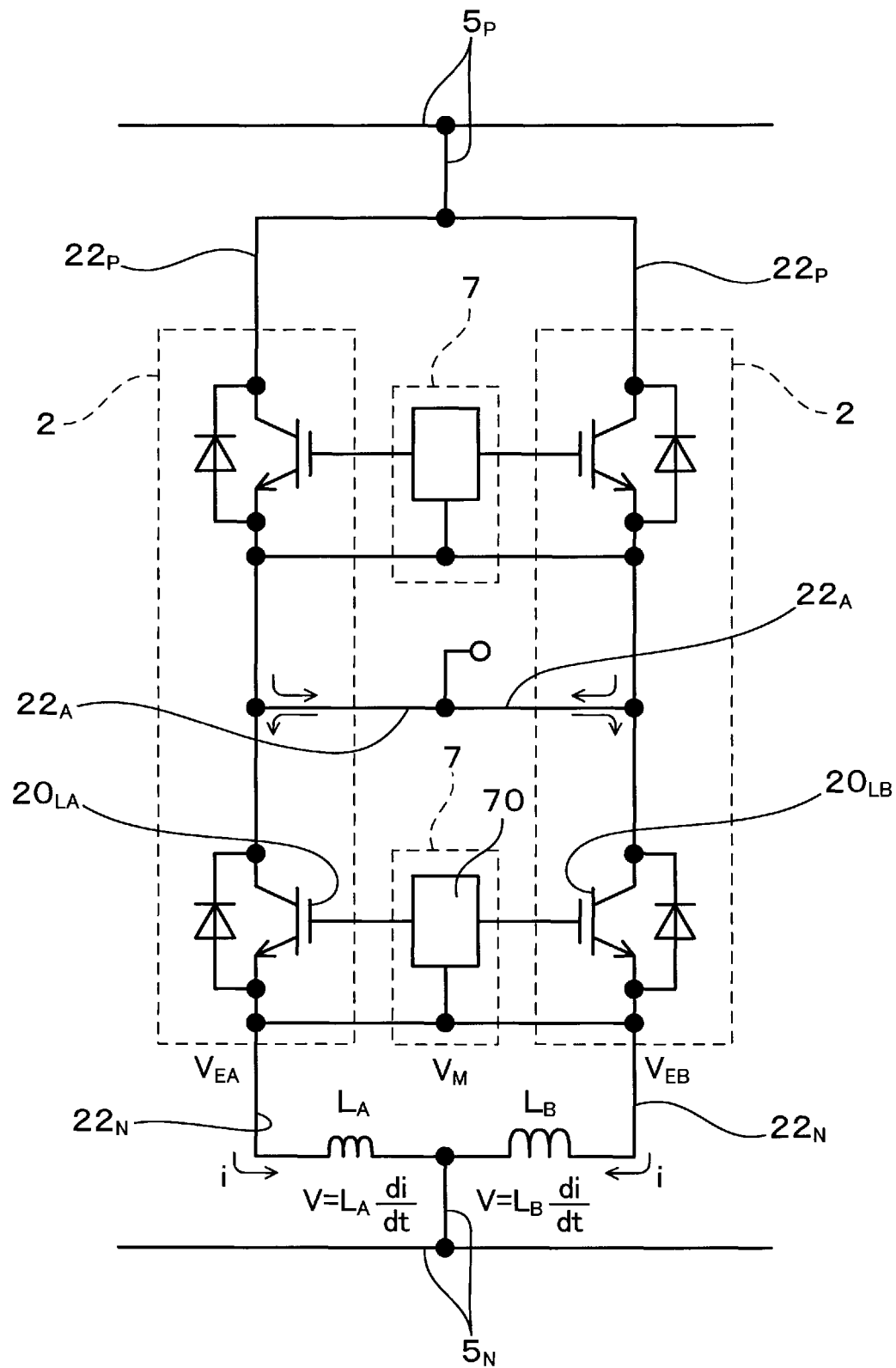
FIG. 25 is a circuit diagram of a part of a power conversion device according to a second comparative embodiment.

That is, as illustrated in FIG. 25, in a case where the upper-arm switching element $20_U$ and the lower-arm switching element $20_L$ are incorporated in the same semiconductor module 2 as in the related art, only one AC terminal $22_A$ is formed for the two switching elements $20_U$, $20_L$. Thus, regardless of whether the upper-arm switching element $20_U$ or the lower-arm switching element $20_L$ is turned on, a current constantly flows through the single AC terminal $22_A$, which generates heat. Accordingly, the temperature of the current sensor 4 or the like is likely to be increased.

In contrast, as illustrated in FIG. 5, in a case where the upper-arm switching element $20_U$ and the lower-arm switching element $20_L$ are provided in the separate semiconductor modules 2, in the present embodiment, the AC terminal $22_{AU}$ and AC terminal $22_{AL}$ can be separately provided for the upper-arm switching element $20_U$ and the lower-arm switching element $20_L$, respectively, as in the present embodiment. Thus, when the upper-arm switching element $20_U$ is turned on, a current flows only through the upper-arm-side AC terminal $22_{AU}$. When the lower-arm switching element $20_L$ is turned on, a current flows only through the lower-arm-side AC terminal $22_{AL}$. Accordingly, Joule heat generated from each of the AC terminals $22_{AU}$ and $22_{AL}$ can be reduced, and an increase in the temperature of the current sensor 4 or the like can thus be suppressed that is caused by transmission of the heat to the current sensor 4 or the like.

The present embodiment can synergistically exert the effect of allowing the capacitor 3 and the current sensor 4 to be cooled by positioning the capacitor 3 and the like adjacent to the layered body in the Y direction and the effect of reducing the amount of heat generated by the AC terminals $22_{AU}$ and $22_{AL}$ to suppress an increase in the temperature of the capacitor 3 and the like by separating the upper-arm semiconductor module $2_U$ from the lower-arm semiconductor module $2_L$. This enables the capacitor 3 and the current sensor 4 to be efficiently cooled.

Figure 8:
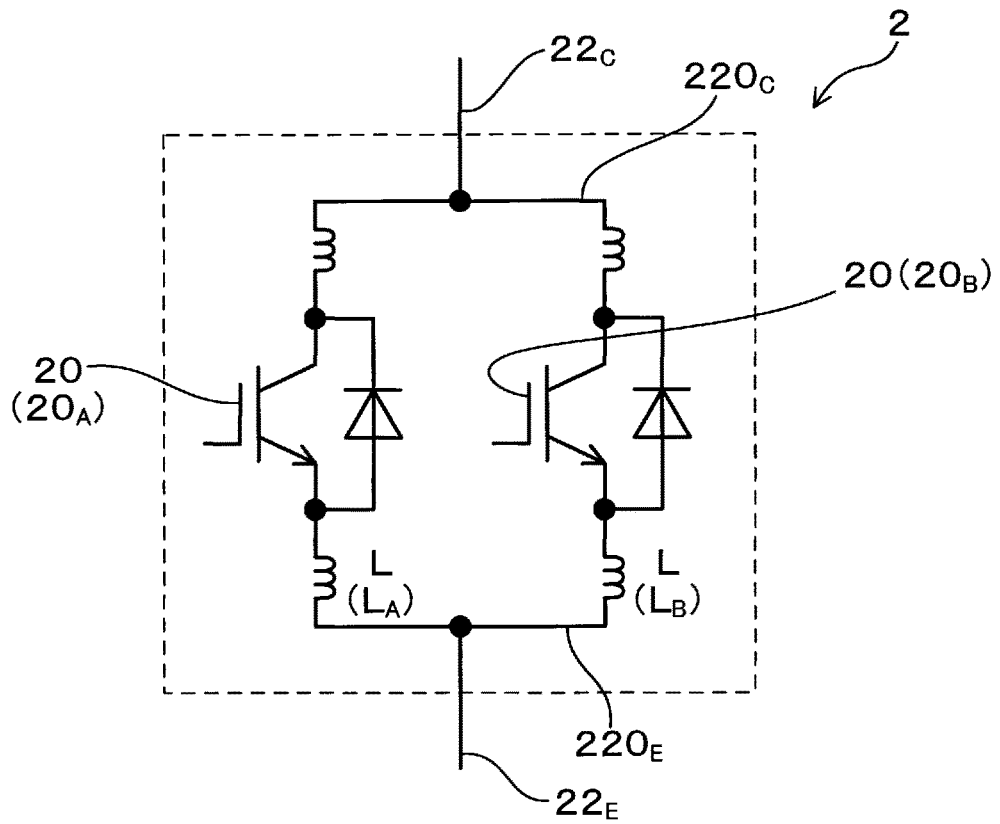
FIG. 8 is a circuit diagram of the semiconductor module according to the first embodiment.

Additionally, the semiconductor module 2 of the present embodiment includes the plurality of switching elements 20 connected together in parallel as illustrated in FIG. 5 and FIG. 8. This allows the switching elements 20 to perform quick switching operations, enabling a reduction in the amount of heat generated by the switching elements 20.

That is, as illustrated in FIG. 25, for example, the two lower-arm switching elements $20_{LA}$ and $20_{LB}$ are provided in the separate semiconductor modules 2 and connected to each other by the negative electrode bus bar $5_N$, according to the related art. In this case, a current path of a current i flowing through the first lower-arm switching element $20_{LA}$ and through the negative electrode bus bar $5_N$ is different in length from a current path of a current i flowing through the second lower-arm switching element $20_{LB}$ and through the negative electrode bus bar $5_N$ because, for example, the negative electrode bus bar $5_N$ is not completely symmetrically formed. Thus, inductances L with different values ($L_A$ and $L_B$) may be parasitic in the two switching elements $20_{LA}$ and $20_{LB}$. In this case, when the two switching elements $20_{LA}$ and $20_{LB}$ are simultaneously turned on to cause the current i to flow, different voltages V (=Ldi/dt) are generated in the respective inductances L ($L_A$ and $L_B$). This results in a difference between potentials $V_{EA}$ and $V_{EB}$ of emitters of the two lower-arm switching elements $20_{LA}$ and $20_{LB}$. A drive circuit 70 applies a voltage to a gate with reference to an intermediate potential $V_M$ between the potentials $V_{EA}$ and $V_{EB}$, and thus a voltage applied between the gate and emitter varies between the two switching elements $20_{LA}$ and $20_{LB}$. This makes the switching elements $20_{LA}$ and $20_{LB}$ likely to oscillate. Inhibiting this problem requires a reduction in switching speed (that is, di/dt) and thus in voltage V (=Ldi/dt) generated in the inductances L ($L_A$ and $L_B$). However, a reduced switching speed tends to lead to an increased switching loss. Note that a similar problem occurs in the upper-arm switching elements $20_{UA}$ and $20_{UB}$.

In contrast, as illustrated in FIG. 8, in a case where the two parallel-connected switching elements $20_A$ and $20_B$ are provided in one semiconductor module 2 as in the present embodiment, currents in the switching elements $20_A$ and $20_B$ both flow through the heat sink 220 in the semiconductor module 2, allowing the parasitic inductances L ($L_A$ an $L_B$) to be easily reduced and equalized. Thus, even in a case where the switching elements $20_A$ and $20_B$ are turned on at a high switching speed, a substantially equal voltage V (=Ldi/dt) can be generated in the inductances L ($L_A$ and $L_B$). Accordingly, oscillation is less likely to occur in spite of an increased switching speed. Thus, a loss in each switching element 20 can be reduced. As a result, a disadvantageous increase in the temperature of the capacitor 3 or the current sensor 4 can be suppressed that is caused by transmission of the heat to the capacitor 3 or the current sensor 4.

Additionally, as illustrated in FIG. 1 and FIG. 4, the DC terminals $22_P$ and $22_N$ of the semiconductor module are disposed closer to the capacitor 3 in the Y direction, and the AC terminal $22_A$ is disposed closer to the current sensor 4 in the Y direction.

This enables a reduction in the lengths, in the Y direction, of the DC bus bars $5_P$ and $5_N$ connecting the capacitor 3 to the DC terminals $22_P$ and $22_N$, respectively. Additionally, the length, in the Y direction, of the AC bus bar 6 from the AC terminal $22_A$ to the current sensor 4 can be reduced. Accordingly, Joule heat generated from the bus bars 5 and 6 can be reduced, allowing suppression of an increase in the temperatures of the capacitor 3 and the current sensor 4.

Additionally, as illustrated in FIG. 6, in the present embodiment, the switching element 20 and the freewheel diode 23 are formed in the same semiconductor chip 24.

Thus, the semiconductor module 2 can be miniaturized. Accordingly, the distance from each of the switching elements 20 to each of the power terminals $22_C$ and $22_E$ can be reduced, enabling a reduction in inductance parasitic between the switching element 20 and each of the power terminals $22_C$ and $22_E$. Thus, a variation in inductance can be reduced, enabling an increase in switching speed. Accordingly, a loss in each switching element 20 can be reduced, allowing suppression of heat generation by the semiconductor module 2. Thus, a disadvantageous increase in the temperature of the capacitor 3 or the current sensor 4 can be suppressed that is caused by transmission of heat from the semiconductor module 2 to the capacitor 3 or the current sensor 4.

As described above, according to the present embodiment, a power conversion device can be provided that is capable of improving the efficiency of cooling of the capacitor and the current sensor and reducing the length of the entire apparatus in the protruding direction of the power terminals.

Note that, in the present embodiment, the RC-IGBT is used as the switching element 20 but that such a limitation is not intended by the present disclosure and that a MOSFET may be used as the switching element 20.

Figure 9:
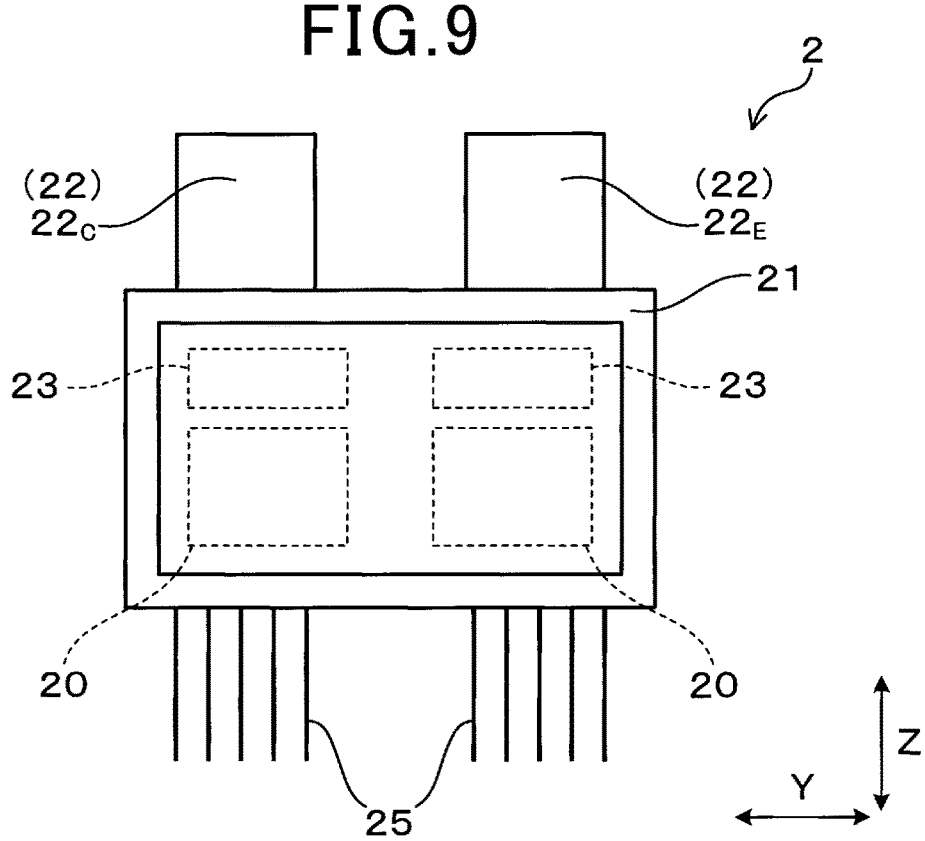
FIG. 9 is a plan view of a semiconductor module in which a switching element is separated from a freewheel diode according to the first embodiment.

Additionally, as illustrated in FIG. 6, the switching element 20 and the freewheel diode 23 are formed in the same semiconductor chip 24 according to the present embodiment. However, such a limitation is not intended by the present disclosure. That is, as illustrated in FIG. 9, the switching element 20 may be separated from the freewheel diode 23.

In the embodiments described below, those of the reference signs used in the drawings which are the same as the reference numerals used in the first embodiment represent components similar to those in the first embodiment unless otherwise noted.

Second Embodiment

Figure 10:
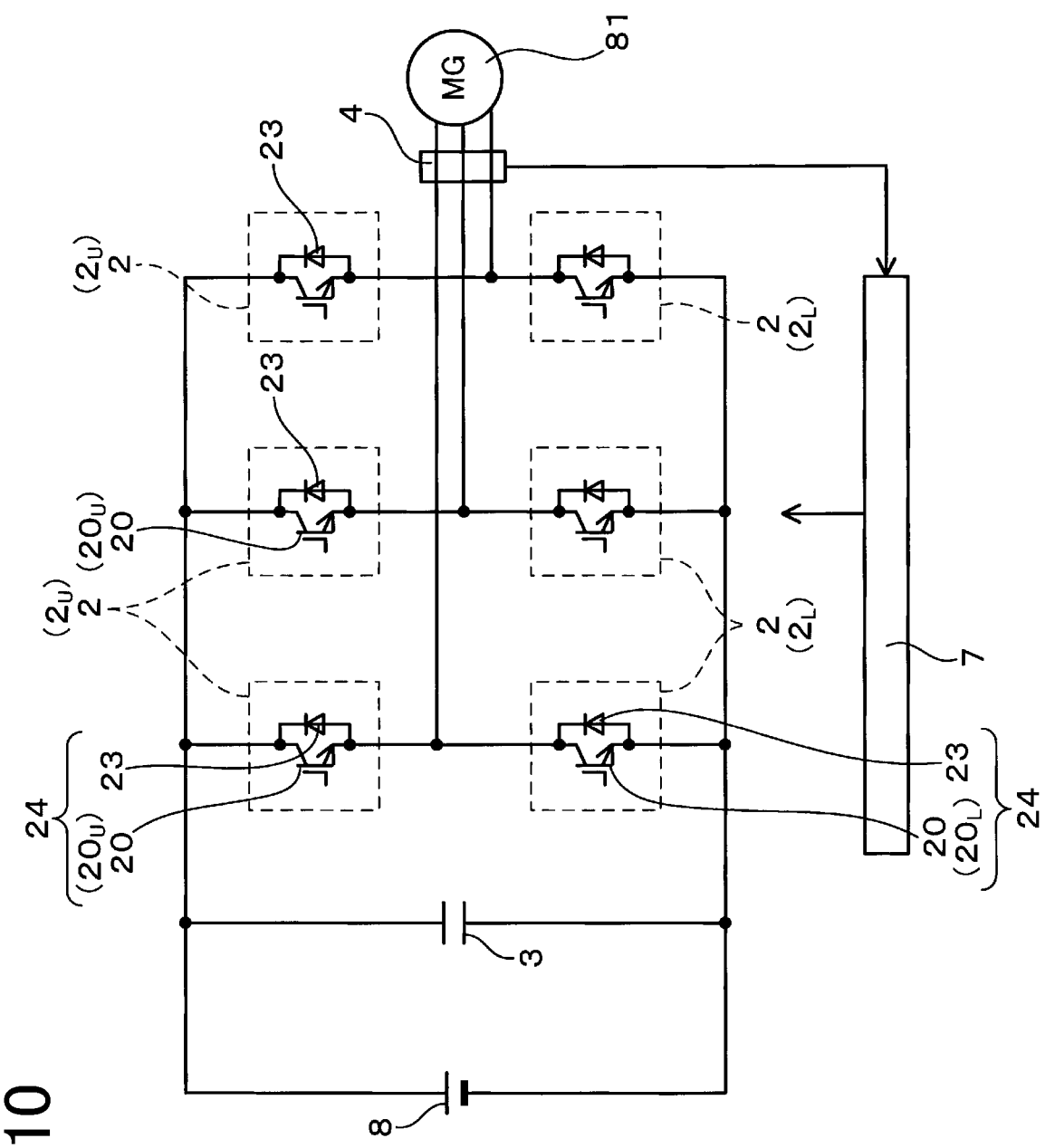
FIG. 10 is a circuit diagram of a power conversion device according to a second embodiment.
Figure 11:
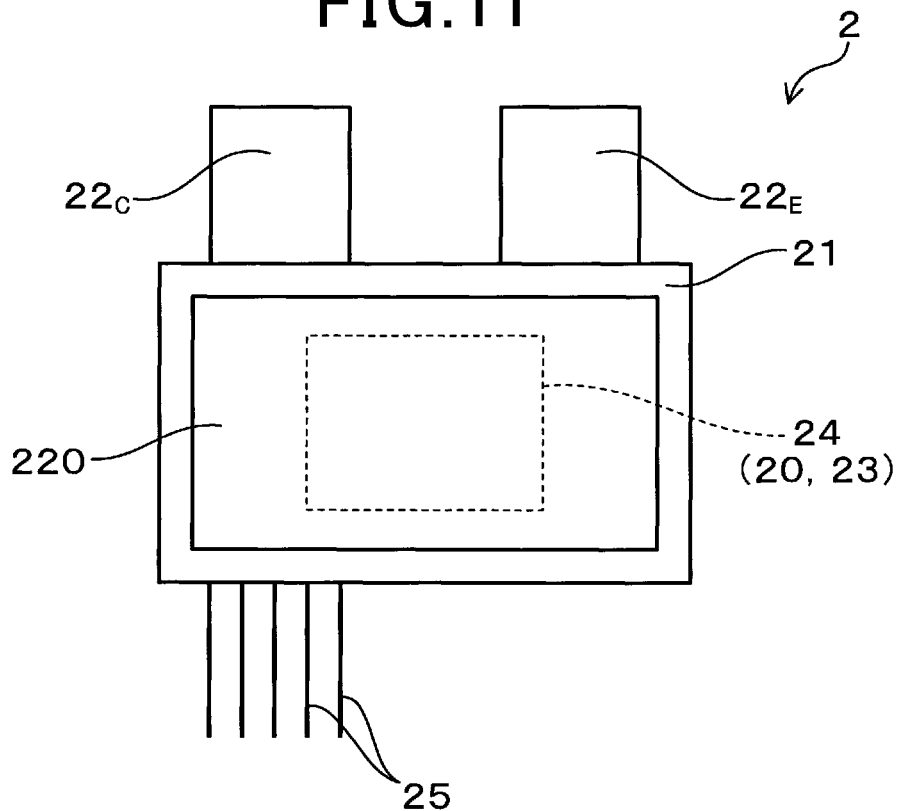
FIG. 11 is a plan view of a semiconductor module according to the second embodiment.

The present embodiment is an example of a modified configuration of the semiconductor module 2. As illustrated in FIG. 10 and FIG. 11, in the present embodiment, only one switching element 20 is incorporated in one semiconductor module 2. The freewheel diode 23 is connected in antiparallel with each switching element 20. The switching element 20 and the freewheel diode 23 are formed in the same semiconductor chip 24.

The semiconductor modules 2 include the upper-arm semiconductor modules $2_U$ and the lower-arm semiconductor modules $2_L$. In the present embodiment, the upper-arm semiconductor modules $2_U$ and the lower-arm semiconductor modules $2_L$ are alternately layered as is the case with the first embodiment (see FIG. 1). Additionally, the capacitor 3 is disposed on one side of the layered body 10 and the current sensor 4 is disposed on the opposite side of the layered body 10, in the Y direction.

The second embodiment otherwise has components, functions, and effects similar to those of the first embodiment.

Figure 12:
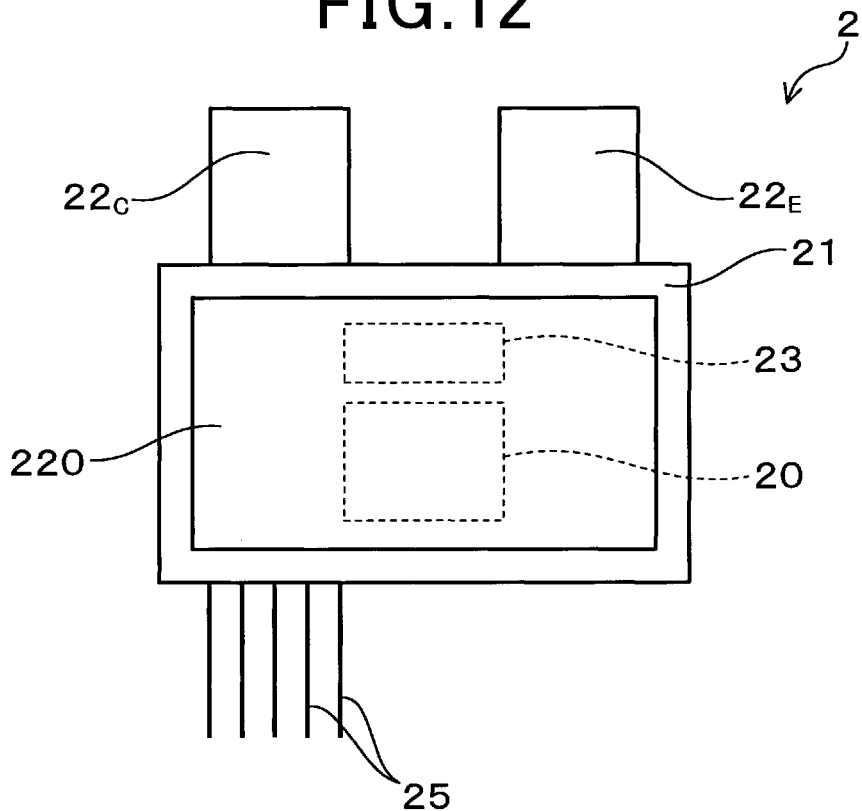
FIG. 12 is a plan view of a semiconductor module in which a switching element is separated from a freewheel diode according to the second embodiment.

Note that, in the present embodiment, the switching element 20 and the freewheel diode 23 are formed in the same semiconductor chip 24 as illustrated in FIG. 11 but that such a limitation is not intended by the present disclosure. That is, as illustrated in FIG. 12, the switching element 20 may be separated from the freewheel diode 23.

Third Embodiment

Figure 13:
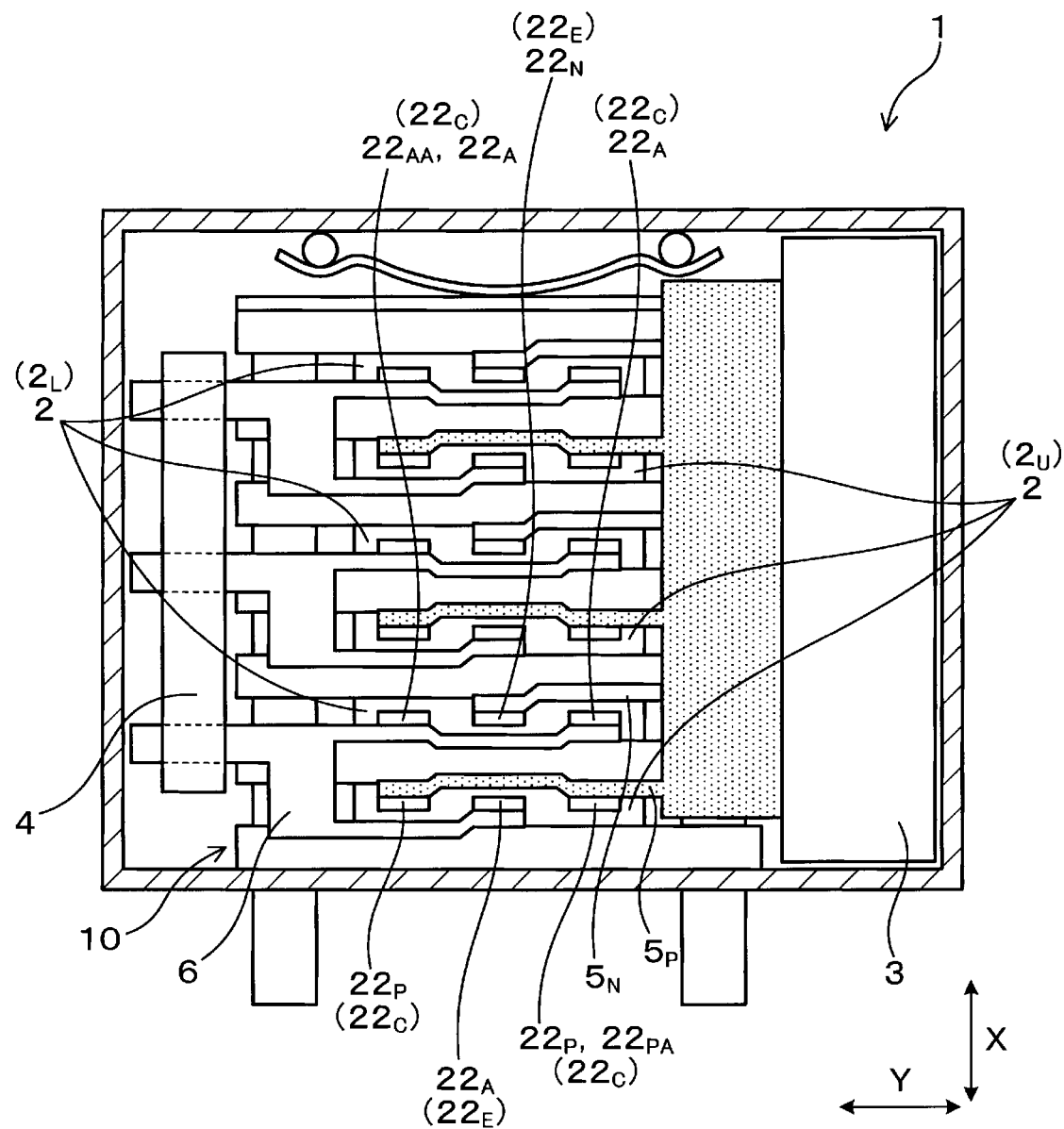
FIG. 13 is a cross-sectional view of a power conversion device according to a third embodiment.
Figure 14:
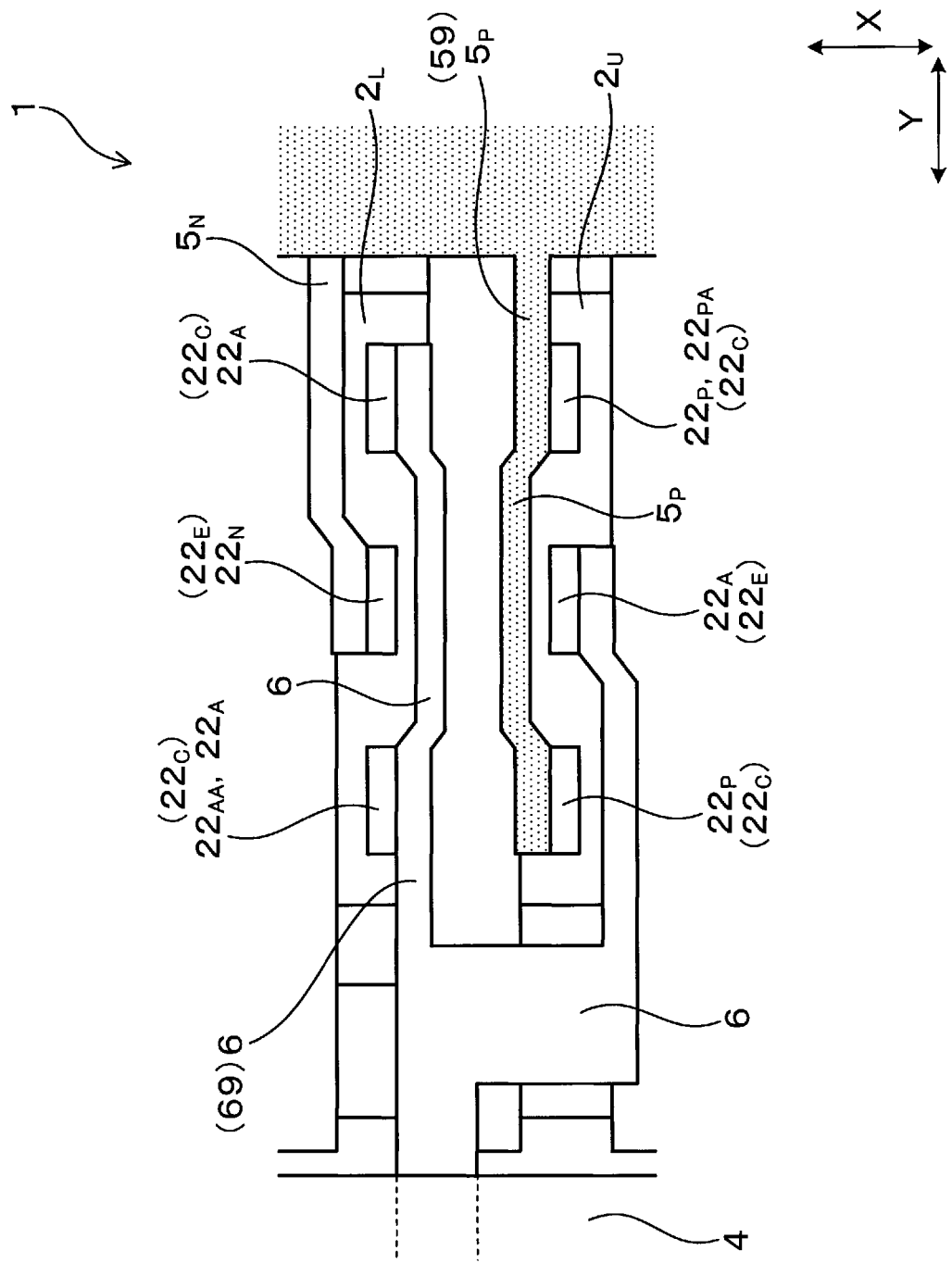
FIG. 14 is an enlarged view of a main part of FIG. 13.

The present embodiment is an example of a modified configuration of the semiconductor module 2. As illustrated in FIG. 13 and FIG. 14, in the present embodiment, one semiconductor module 2 (in the present embodiment, the upper-arm semiconductor module $2_U$), included in the two types of semiconductor modules 2: the upper-arm semiconductor module $2_U$ and the lower-arm semiconductor module $2_L$, includes two DC terminals (positive electrode terminals $22_P$) and one AC terminal $22_A$. Additionally, the other semiconductor module 2 (in the present embodiment, the lower-arm semiconductor module $2_L$) includes two AC terminals $22_A$ and one DC terminal 22 ($22_N$).

The two DC terminals 22 ($22_P$) of the upper-arm semiconductor module $2_U$ are coupled to each other by the DC bus bar $5_P$. Additionally, the DC bus bar $5_P$ extends from the DC terminal 22 ($22_{P4}$), included in the two DC terminals 22 ($22_P$) and located closer to the capacitor 3 in the Y direction, toward the capacitor 3 in the Y direction.

In addition, the two DC terminals 22 ($22_A$) of the lower-arm semiconductor module $2_L$ are coupled to each other by the AC bus bar 6. The AC bus bar 6 extends from the AC terminal 22 ($22_{AA}$), included in the two AC terminals 22 ($22_A$) and located closer to the current sensor 4 in the Y direction, toward the current sensor 4 in the Y direction.

Figure 15:
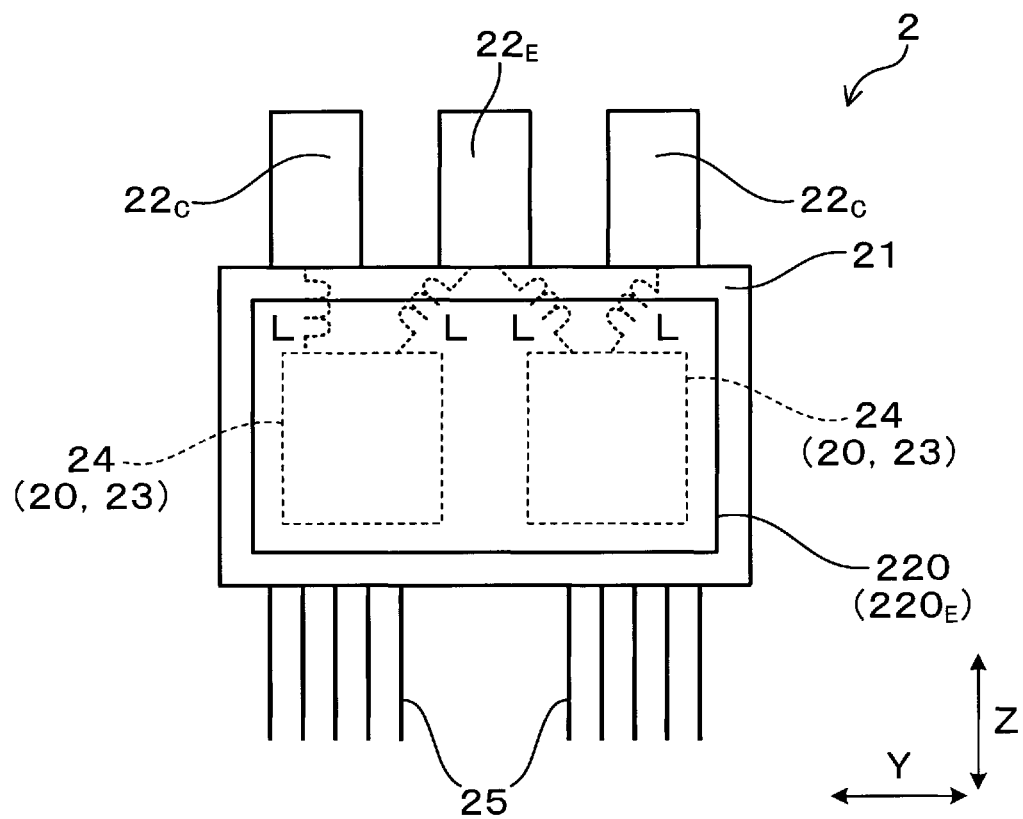
FIG. 15 is a plan view of a semiconductor module according to the third embodiment.
Figure 16:
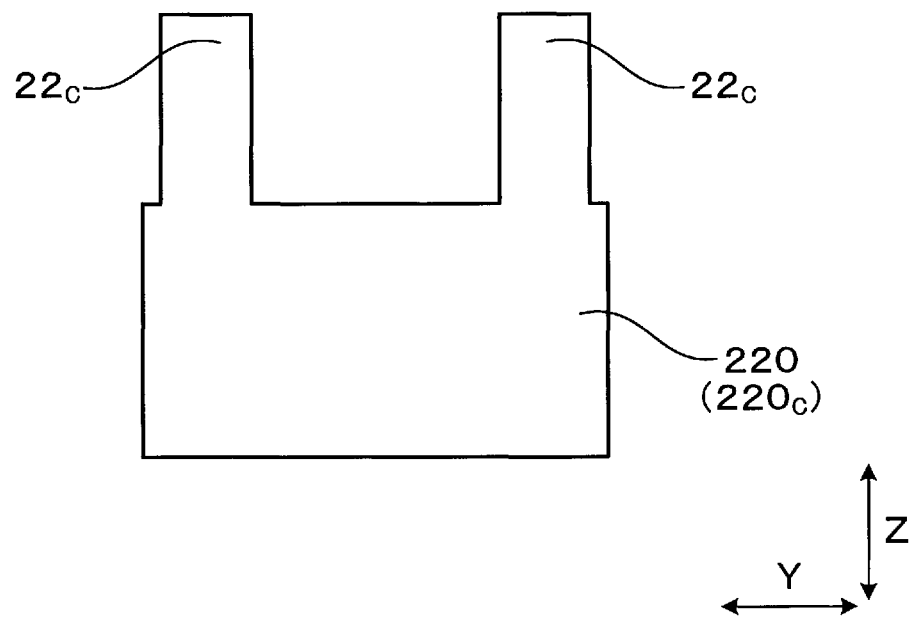
FIG. 16 is a plan view of collector terminals and a collector-side heat sink according to the third embodiment.
Figure 17:
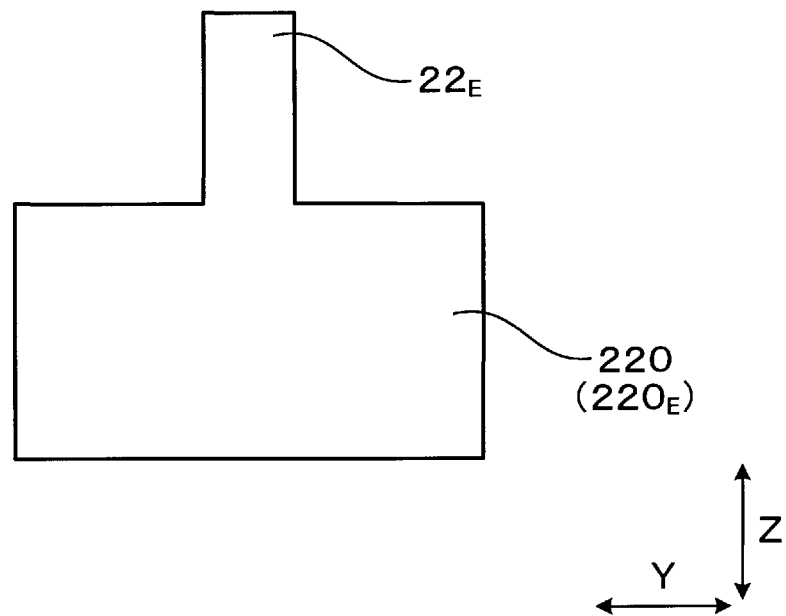
FIG. 17 is a plan view of an emitter terminal and an emitter-side heat sink according to the third embodiment.

As illustrated in FIG. 15, the semiconductor module 2 of the present embodiment incorporates two parallel-connected switching elements 20. Two collector terminals $22_C$ and one emitter terminal $22_E$ protrude from the body portion 21 of the semiconductor module 2. The emitter terminal $22_E$ is positioned between the two collector terminals $22_C$ in the Y direction. As illustrated in FIGS. 15 to 17, the semiconductor module 2 of the present embodiment includes the collector-side heat sink $220_C$ and the emitter-side heat sink $220_E$ as is the case with the first embodiment. The two collector terminals $22_C$ protrude from the collector-side heat sink $200_C$. Additionally, the one emitter terminal $22_E$ protrudes from the emitter-side heat sink $220_E$.

Figure 19:
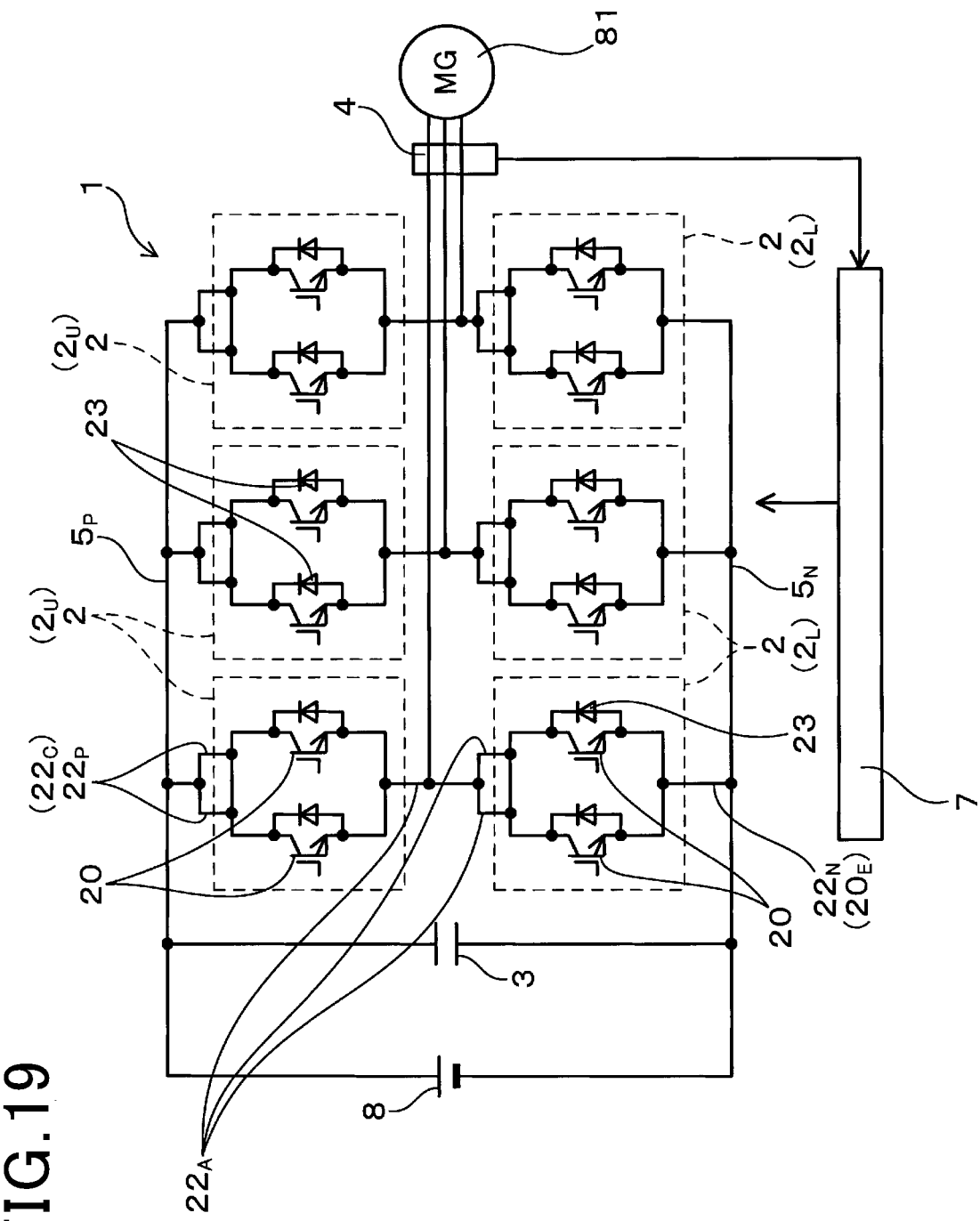
FIG. 19 is a circuit diagram of the power conversion device according to the third embodiment.

In the present embodiment, as illustrated in FIG. 14 and FIG. 19, the two collector terminals $22_C$ of the upper-arm semiconductor module $2_U$ are used as positive electrode terminals $22_P$, and the one emitter terminal $22_E$ of the upper-arm semiconductor module $2_U$ is used as the AC terminal $22_A$. Additionally, the two collector terminals $22_C$ of the lower-arm semiconductor module $2_L$ are used as the AC terminals $22_A$, and the one emitter terminal $22_E$ of the lower-arm semiconductor module $2_L$ is used as the negative electrode terminal $22_N$.

Functions and effects of the present embodiment will be described. In the present embodiment, as illustrated in FIG. 15, the one emitter terminal $22_E$ is disposed between the two collector terminals $22_C$.

Figure 18:
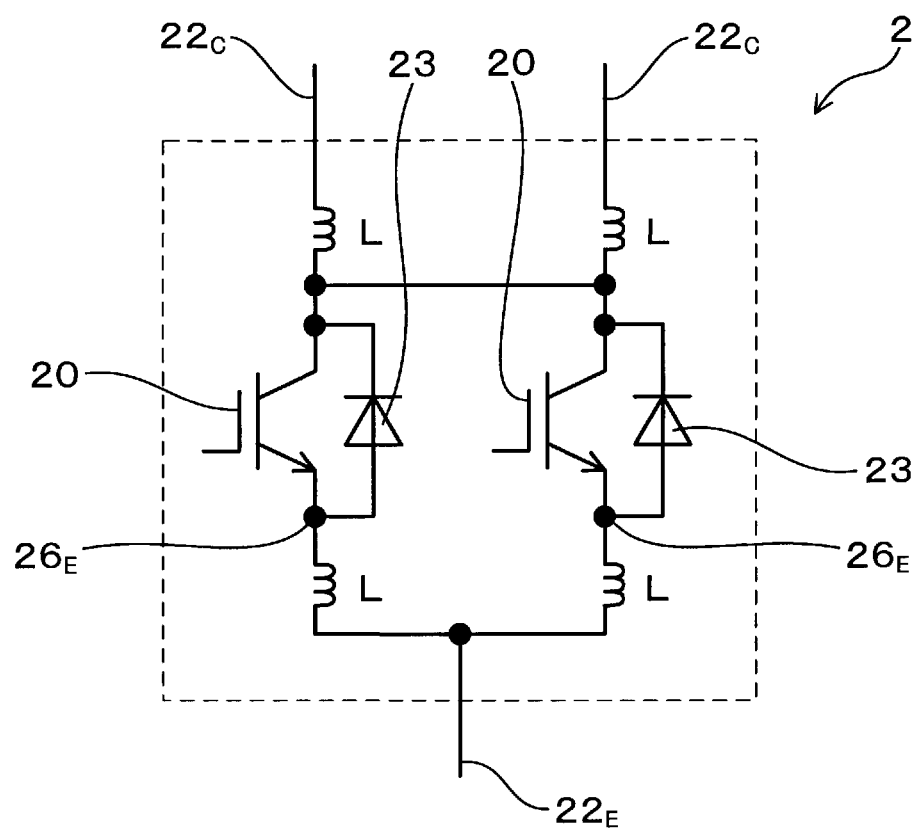
FIG. 18 is a circuit diagram of the semiconductor module according to the third embodiment.

This allows the distances from the respective switching elements 20 to the emitter terminal $22_E$ to be equalized. Thus, the inductances L (see FIG. 18) parasitic in the emitters of the switching elements 20 can be equalized, and oscillation is less likely to occur in spite of quick switching operations of the switching elements 20. This enables a reduction in loss in each switching element 20, allowing suppression of heat generation by the semiconductor module 2. Accordingly, a disadvantageous increase in the temperature of the capacitor 3 or the current sensor 4 can be suppressed that is caused by transmission of the generated heat to the capacitor 3 or the current sensor 4.

Additionally, as illustrated in FIG. 13 and FIG. 14, the DC bus bar $5_P$ extends from the DC terminal $22_{P4}$, which is included in the two DC terminals $22_P$ formed in the upper-arm semiconductor module $2_U$ and which is located closer to the capacitor 3, toward the capacitor 3 in the Y direction.

This enables a reduction in the length, in the Y direction, of a portion 59 of the DC bus bar $5_P$ that electrically connects the DC terminal $22_P$ and the capacitor 3. Thus, Joule heat generated from the portion 59 can be reduced, allowing further suppression of an increase in the temperature of the capacitor 3.

Additionally, the AC bus bar 6 extends from the AC terminal $22_{AA}$, which is included in the two AC terminals $22_A$ formed in the lower-arm semiconductor module $2_L$ and which is located closer to the current sensor 4, toward the current sensor 4 in the Y direction.

This enables a reduction in the length, in the Y direction, of a portion 69 of the AC bus bar 6 that electrically connects the AC terminal $22_A$ and the current sensor 4. Thus, Joule heat generated from the portion 69 can be reduced, allowing further suppression of an increase in the temperature of the current sensor 4.

The third embodiment otherwise has components, functions, and effects similar to those of the first embodiment.

Fourth Embodiment

Figure 21:
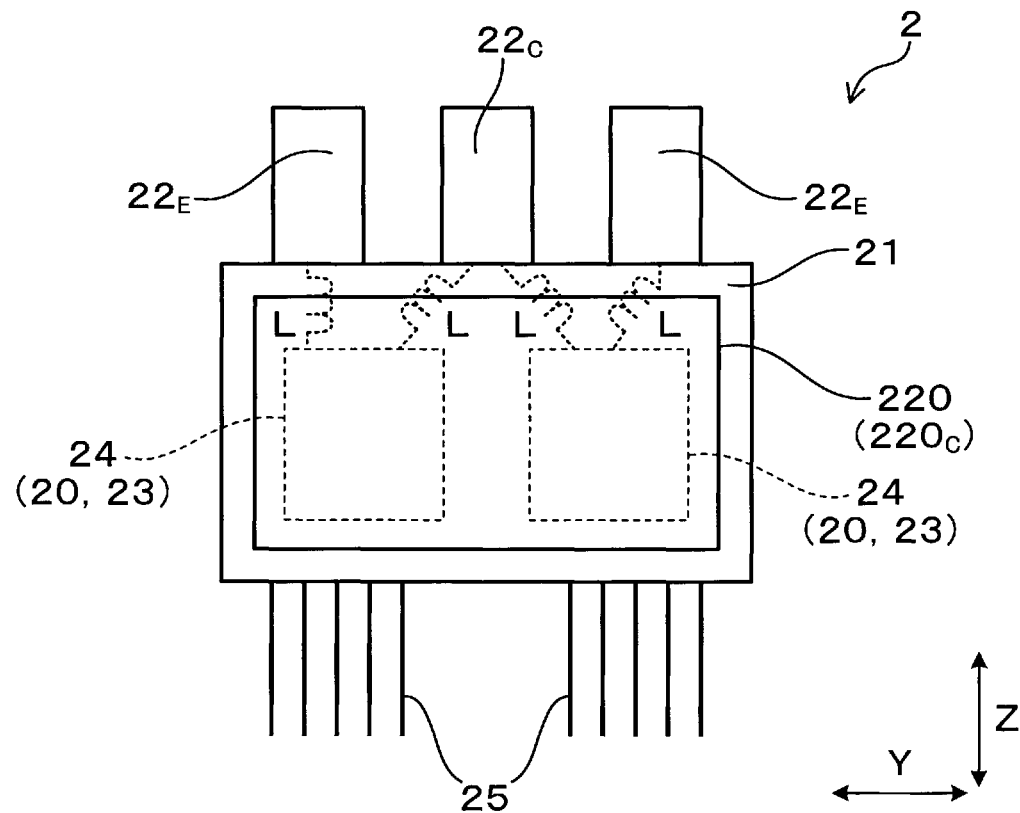
FIG. 21 is a plan view of a semiconductor module according to the fourth embodiment.
Figure 22:
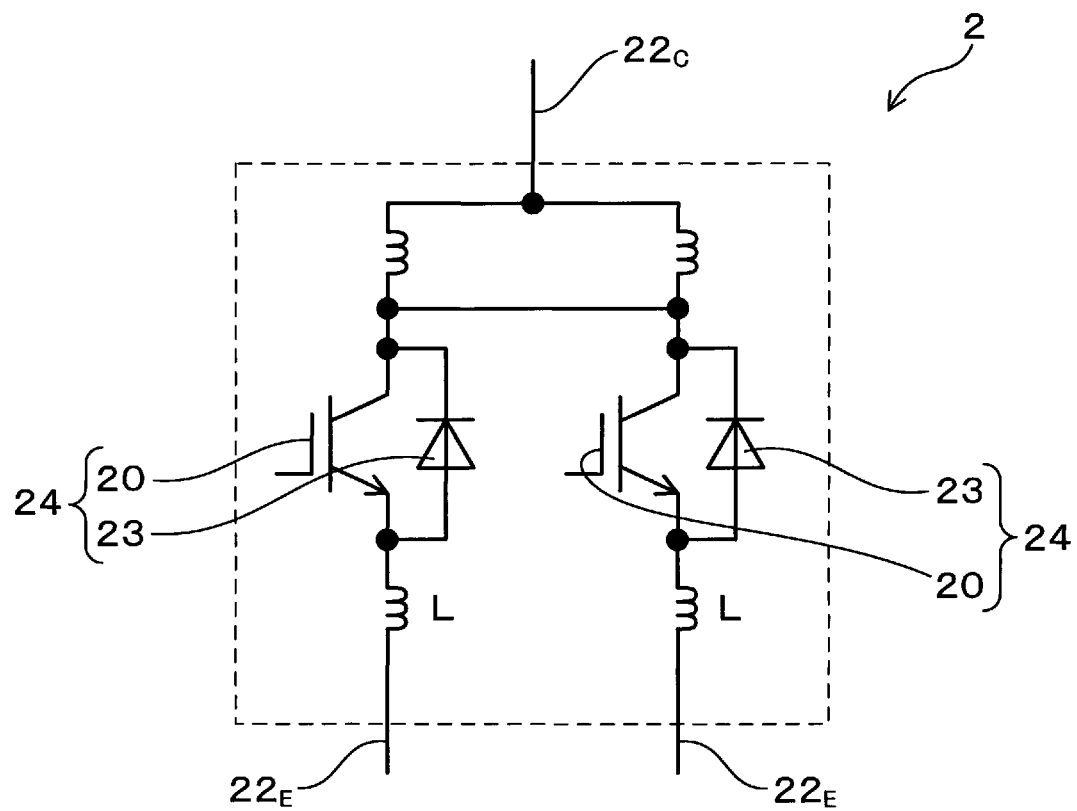
FIG. 22 is a plan view of the semiconductor module according to the fourth embodiment.

The present embodiment is an example of a modified configuration of the semiconductor module 2. As illustrated in FIG. 21, the semiconductor module 2 includes two emitter terminals $22_E$ and one collector terminal $22_C$. The collector terminal $22_C$ is disposed between the two emitter terminals $22_E$.

This configuration allows the inductances L parasitic in the emitters of the switching elements 20 to equalized. Accordingly, oscillation is less likely to occur in spite of quick switching operations of the switching elements 20, enabling a reduction in loss in each switching element 20. This enables a reduction in the amount of heat generated by the semiconductor module 2, allowing a disadvantageous increase in the temperature of the capacitor 3 or the current sensor 4 caused by transmission of the heat to the capacitor 3 or the current sensor 4.

Figure 20:
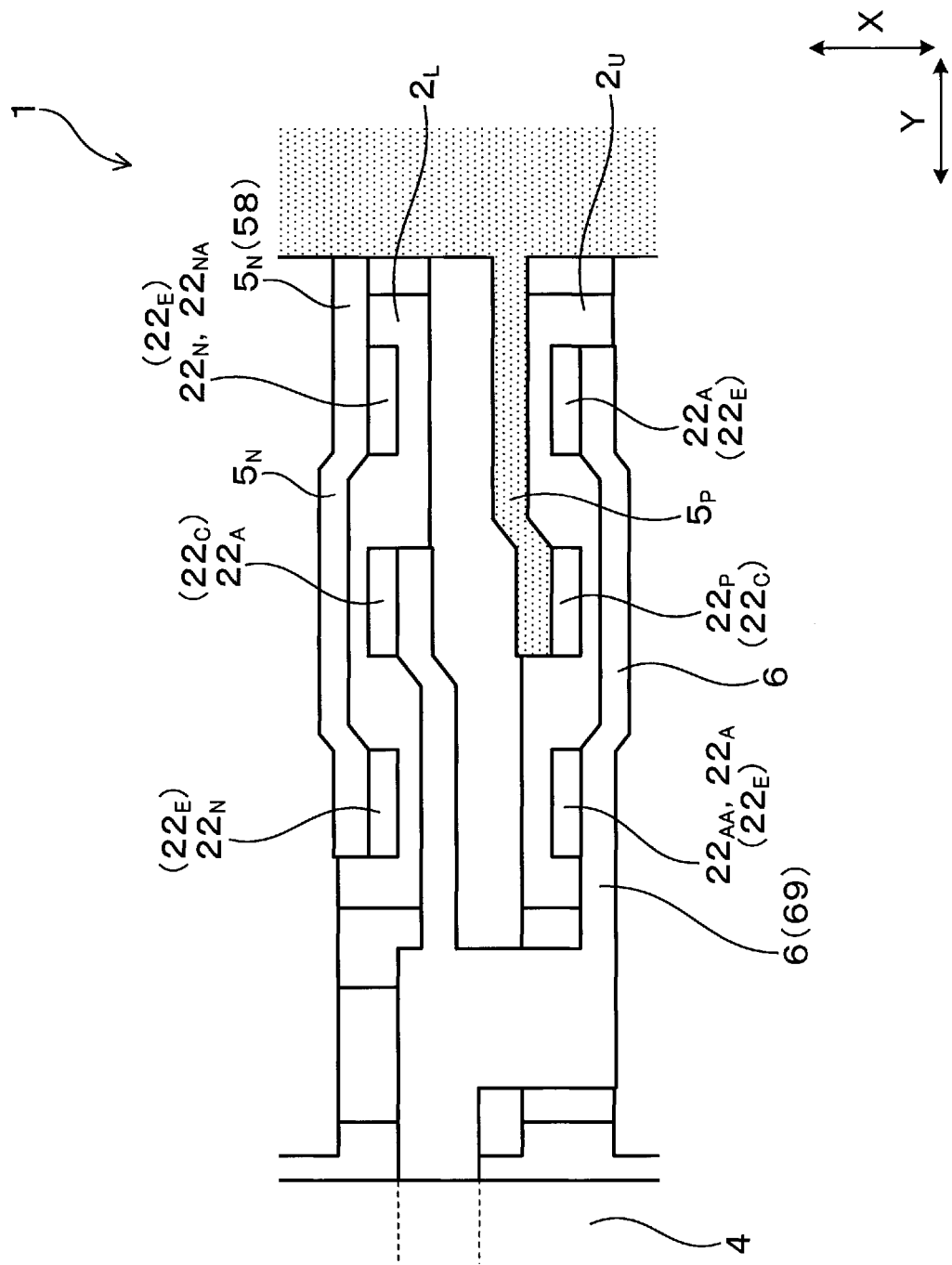
FIG. 20 is an enlarged cross-sectional view of a main part of a power conversion device according to a fourth embodiment.

Additionally, in the present embodiment, the upper-arm semiconductor modules $2_U$ and the lower-arm semiconductor modules $2_L$ are alternately disposed as illustrated in FIG. 20. The two emitter terminals $22_E$ of each of the upper-arm semiconductor modules $2_U$ are used as the AC terminals $22_A$, and the one collector terminal $22_C$ of the upper-arm semiconductor module $2_U$ is used as the positive electrode terminal $22_P$. Additionally, the two emitter terminals $22_E$ of each of the lower-arm semiconductor modules $2_L$ are used as the negative electrode terminals $22_N$, and the one collector terminal $22_C$ of the lower-arm semiconductor module $2_L$ is used as the AC terminal $22_A$.

The two negative electrode terminals $22_N$ of the lower-arm semiconductor module $2_L$ are coupled to each other by the negative electrode bus bar $5_N$. The negative electrode bus bar $5_N$ extends from the negative electrode terminal $22_{NA}$, included in the two negative electrode terminals $22_N$ and located closer to the capacitor 3, toward the capacitor 3 in the Y direction.

This enables a reduction in the length, in the Y direction, of an area 58 of the negative electrode bus bar $5_N$ connecting the negative electrode terminal $22_N$ and the capacitor 3. Thus, heat generated from the area 58 can be reduced, allowing further suppression of an increase in the temperature of the capacitor 3.

Additionally, as illustrated in FIG. 20, the two AC terminals $22_A$ of the upper-arm semiconductor module $2_U$ are coupled to each other by the AC bus bar 6. The AC bus bar 6 extends from the AC terminal $22_{AA}$, included in the two AC terminals $22_A$ and located closer to the current sensor 4, toward the current sensor 4 in the Y direction.

This enables a reduction in the length, in the Y direction, of an area 69 of the AC bus bar 6 connecting the AC terminal $22_A$ and the current sensor 4. Thus, heat generated from the area 69 can be reduced, allowing further suppression of an increase in the temperature of the current sensor 4.

The fourth embodiment otherwise has components, functions, and effects similar to those of the first embodiment.

Fifth Embodiment

Figure 23:
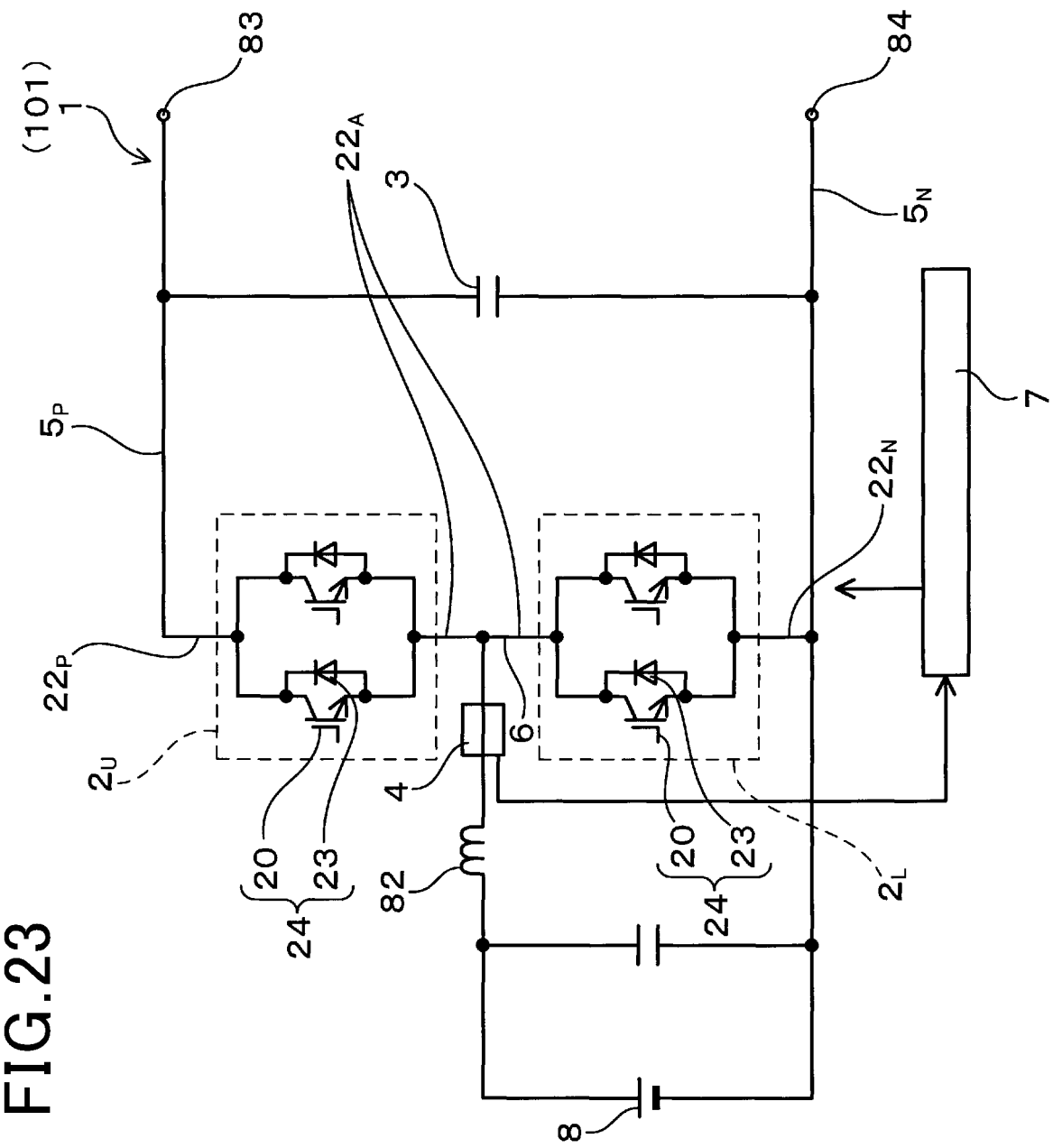
FIG. 23 is a circuit diagram of a power conversion device according to a fifth embodiment.

The present embodiment is an example of a modified circuit configuration of the power conversion device 1. As illustrated in FIG. 23, in the present embodiment, a booster circuit 101 is configured using the upper-arm semiconductor module $2_U$, the lower-arm semiconductor module $2_L$, a capacitor 33, and a reactor 82. The booster circuit 101 is used to increase the voltage of the DC power supply 8 and to output the increased DC power from output terminals 83 and 84.

The fifth embodiment otherwise has components, functions, and effects similar to those of the first embodiment.

The present disclosure is described in compliance with the embodiments. However, it should be appreciated that the present disclosure is not limited to the embodiments or the structures thereof. The present disclosure encompasses various modified examples and modifications within the range of equivalency. In addition, the scope of the present disclosure and the range of ideas thereof include various combinations and forms and other combinations and forms additionally including one or more elements or a portion of one element.

What is claimed is:

1. A power conversion device comprising:
    a layered body comprising semiconductor modules each incorporating switching elements and cooling pipes cooling the semiconductor modules, the semiconductor modules and the cooling pipes being layered;
    a capacitor smoothing a DC voltage applied to each of the semiconductor modules; and
    a current sensor measuring a current flowing through each of the switching elements, wherein
    the semiconductor modules include upper-arm semiconductor modules disposed on an upper arm side and lower-arm semiconductor modules disposed on a lower arm side, the upper-arm semiconductor modules and the lower-arm semiconductor modules being alternately layered in a layering direction of the layered body,
    each of the semiconductor modules includes a body portion incorporating the switching elements and a plurality of power terminals protruding from the body portion, and
    the capacitor is disposed on one side of the layered body and the current sensor is disposed on an opposite side of the layered body, in an orthogonal direction orthogonal to both a protruding direction of the power terminals and the layering direction, and
    each of the semiconductor modules includes, as the power terminals, two collector terminals connected to a collector electrode of the switching element and one emitter terminal connected to an emitter electrode of the switching element, and the emitter terminal is disposed between the two collector terminals in the orthogonal direction.

2. The power conversion device according to claim 1, wherein
    each of the semiconductor modules incorporates a plurality of the switching elements connected together in parallel.

3. The power conversion device according to claim 1, wherein
    the power terminals include a DC terminal connected to the capacitor and an AC terminal, a current output from the AC terminal is measured by the current sensor, a first of two types of the semiconductor modules including the upper-arm semiconductor module and the lower-arm semiconductor module includes a plurality of the DC terminals, a second of the two types of the semiconductor modules includes a plurality of the AC terminals, a plurality of the DC terminals included in the first semiconductor module are coupled together by a DC bus bar, the DC bus bar extends from the DC terminal included in the plurality of DC terminals and located closer to the capacitor, toward the capacitor in the orthogonal direction, a plurality of the AC terminals included in the second semiconductor module are coupled together by an AC bus bar, and the AC bus bar extends from the AC terminal included in the plurality of AC terminals and located closer to the current sensor, toward the current sensor in the orthogonal direction.

4. The power conversion device according to claim 1, wherein for each of the switching elements, a freewheel diode is connected in antiparallel with the switching element, and the switching element and the freewheel diode are formed in a same semiconductor chip.

* * * * *